United States Patent
Sekiguchi

(10) Patent No.: US 9,698,796 B2
(45) Date of Patent: Jul. 4, 2017

(54) DYNAMIC CLOCK SYNCHRONIZATION

(71) Applicant: FUJITSU LIMITED, Kawasaki-shi, Kanagawa (JP)

(72) Inventor: Hideyuki Sekiguchi, Setagaya (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/198,303

(22) Filed: Jun. 30, 2016

(65) Prior Publication Data
US 2017/0019113 A1    Jan. 19, 2017

(30) Foreign Application Priority Data
Jul. 17, 2015 (JP) .................. 2015-142994

(51) Int. Cl.
G06F 1/12     (2006.01)
H03L 7/00     (2006.01)
H03L 3/00     (2006.01)

(52) U.S. Cl.
CPC ................ H03L 7/00 (2013.01); G06F 1/12 (2013.01); H03L 3/00 (2013.01)

(58) Field of Classification Search
CPC ..................................... G06F 1/12; H03L 7/00
USPC ................ 327/141, 142, 291, 293, 295, 296
See application file for complete search history.

(56) References Cited

U.S. PATENT DOCUMENTS

| | | | |
|---|---|---|---|
| 2005/0195674 A1* | 9/2005 | Jang | G11C 11/40615 365/222 |
| 2006/0049863 A1* | 3/2006 | Endo | G06F 1/10 327/295 |
| 2009/0115474 A1* | 5/2009 | Lee | H03L 7/0812 327/158 |
| 2010/0117697 A1 | 5/2010 | Kanno et al. | |
| 2016/0285437 A1* | 9/2016 | Thazhatheppattu | G06F 1/10 |

FOREIGN PATENT DOCUMENTS

| | | |
|---|---|---|
| JP | 2002-190528 | 7/2002 |
| JP | 2010-4352 | 1/2010 |
| JP | 2010-118746 | 5/2010 |
| JP | 2011-164988 | 8/2011 |

* cited by examiner

Primary Examiner — William Hernandez
(74) Attorney, Agent, or Firm — Staas & Halsey LLP

(57) ABSTRACT

A semiconductor device includes: a clock synchronizing circuit that operates in synchronization with a clock; an enable signal generating circuit that generates an enable signal in an operation period during which the clock synchronizing circuit is operated; and a clock supplying circuit that supplies a clock to the clock synchronizing circuit or stop the supply of the clock according to the enable signal when a clock frequency is equal to or lower than a predetermined frequency, and supply a clock to the clock synchronizing circuit, irrespective of the enable signal, when the clock frequency is higher than the predetermined frequency.

7 Claims, 24 Drawing Sheets

FIG. 7

| CLK FREQUENCY | 2.0GHz (FRQ=0) | 1.8GHz (FRQ=1) | 1.6GHz (FRQ=2) | 1.4GHz (FRQ=3) | 1.2GHz (FRQ=4) | 1.0GHz (FRQ=5) |
|---|---|---|---|---|---|---|
| FTBL[4:0] | (00000)b | (00001)b | (00011)b | (00111)b | (01111)b | (11111)b |
| CIRCUIT BLOCK 40a (FCNT=FTBL[4]) [1.0GHz] | FCNT=L ENC=H | FCNT=L ENC=H | FCNT=L ENC=H | FCNT=L ENC=H | FCNT=L ENC=H | FCNT=H ENC=L or H |
| CIRCUIT BLOCK 40a (FCNT=FTBL[3]) [1.2GHz] | FCNT=L ENC=H | FCNT=L ENC=H | FCNT=L ENC=H | FCNT=L ENC=H | FCNT=H ENC=L or H | FCNT=H ENC=L or H |
| CIRCUIT BLOCK 40a (FCNT=FTBL[2]) [1.4GHz] | FCNT=L ENC=H | FCNT=L ENC=H | FCNT=L ENC=H | FCNT=H ENC=L or H | FCNT=H ENC=L or H | FCNT=H ENC=L or H |
| CIRCUIT BLOCK 40b (FCNT=FTBL[1]) [1.6GHz] | FCNT=L ENC=H | FCNT=L ENC=H | FCNT=H ENC=L or H | FCNT=H ENC=L or H | FCNT=H ENC=L or H | FCNT=H ENC=L or H |
| CIRCUIT BLOCK 40c (FCNT=FTBL[0]) [1.8GHz] | FCNT=L ENC=H | FCNT=H ENC=L or H | FCNT=H ENC=L or H | FCNT=H ENC=L or H | FCNT=H ENC=L or H | FCNT=H ENC=L or H |
| CIRCUIT BLOCK 40d (FCNT=H) [2.0GHz] | FCNT=H ENC=L or H | FCNT=H ENC=L or H | FCNT=H ENC=L or H | FCNT=H ENC=L or H | FCNT=H ENC=L or H | FCNT=H ENC=L or H |

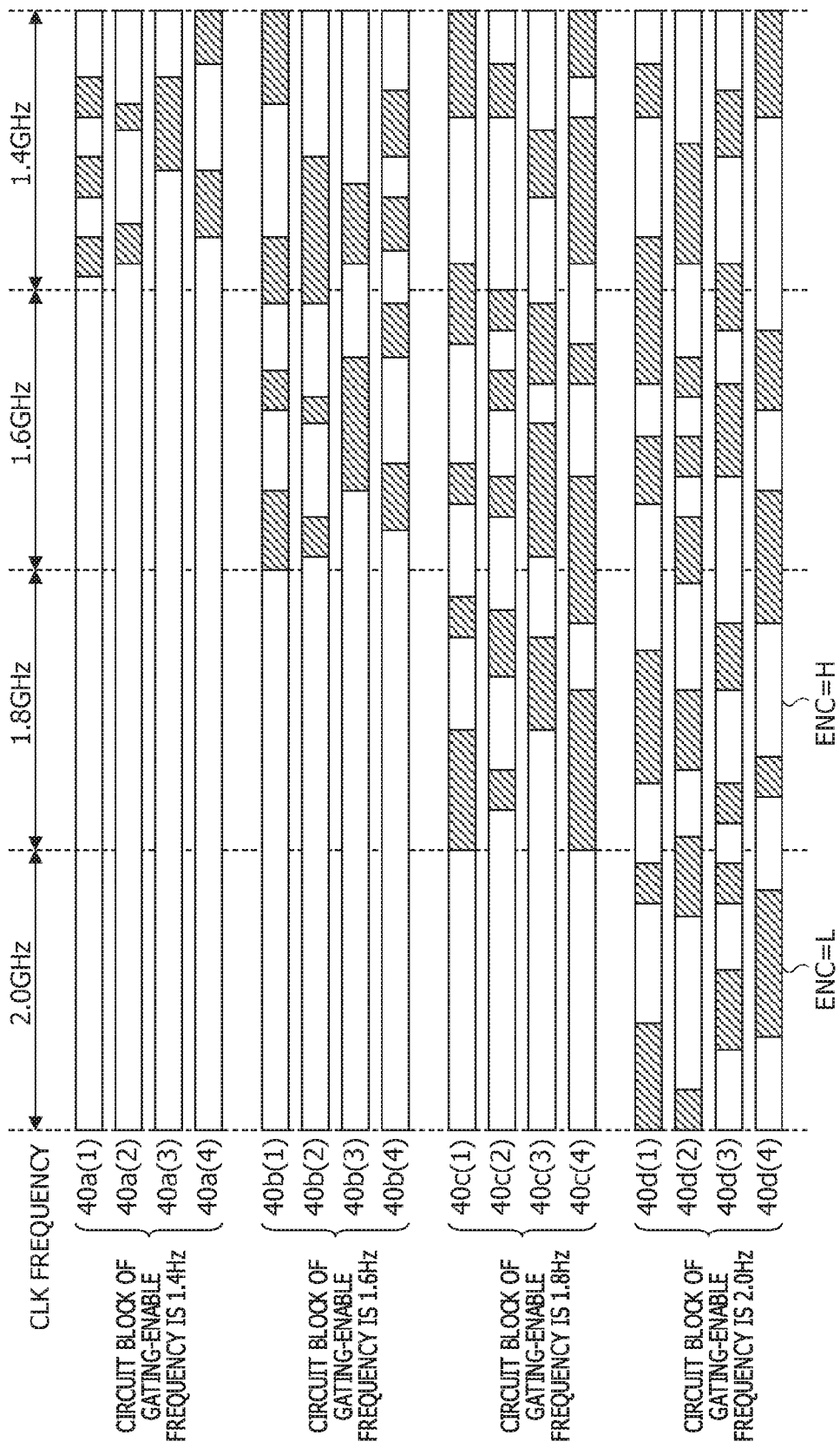

DYNAMIC CLOCK SYNCHRONIZATION

CROSS-REFERENCE TO RELATED APPLICATION

This application is based upon and claims the benefit of priority of the prior Japanese Patent Application No. 2015-142994, filed on Jul. 17, 2015, the entire contents of which are incorporated herein by reference.

FIELD

The embodiments discussed herein are related to a semiconductor device and a method for controlling the semiconductor device.

BACKGROUND

In an effort to reduce the power consumption of a semiconductor device such as, for example, a processor operating in synchronization with a clock signal, there has been proposed a Dynamic Voltage and Frequency Scaling (DVFS) method of changing a voltage and a frequency dynamically. Such a kind of semiconductor device employs a clock gating method that stops supplying of a clock to an inactive circuit block so as to further reduce the power consumption.

In the clock gating method, a clock gating circuit for interrupting the supply of the clock to the circuit block according to a logic of an enable signal is inserted into an input path of the clock to the circuit block. In the clock gating circuit, the timing of a transition edge of the enable signal for a transition edge of the clock varies along with a change in frequency of the clock. For this reason, a timing constraint of the enable signal may not be satisfied due to, for example, an occurrence of a glitch in a clock output from the clock gating circuit depending on the clock frequency.

When it is determined by timing verification of the circuit block that the timing constraint of the enable signal is not satisfied, the clock gating circuit is not inserted into the circuit block or the clock gating circuit is changed to a circuit satisfying the timing constraint. In addition, the glitch occurring in the clock is suppressed by arranging clock gating circuits in series on a clock tree.

In a semiconductor device which dynamically changes a clock frequency, whether to insert a clock gating circuit based on a timing constraint of an enable signal is determined by the maximum frequency at which the semiconductor device may be operated. For this reason, the clock gating circuit is not inserted into a circuit block satisfying the timing constraint of the enable signal at a clock frequency lower than the maximum clock frequency, and the clock is always supplied to the circuit block. Accordingly, when the semiconductor device is operated at the clock frequency lower than the maximum clock frequency, the circuit block into which the clock gating circuit is not inserted exhibits a less effect in the reduction of power consumption as compared to a circuit block into which the clock gating circuit is inserted.

The followings are reference documents.
[Document 1] Japanese Laid-Open Patent Publication No. 2010-118746,
[Document 2] Japanese Laid-Open Patent Publication No. 2011-164988,
[Document 3] Japanese Laid-Open Patent Publication No. 2002-190528, and
[Document 4] Japanese Laid-Open Patent Publication No. 2010-004352.

SUMMARY

According to an aspect of the invention, a semiconductor device includes: a clock synchronizing circuit that operates in synchronization with a clock; an enable signal generating circuit that generates an enable signal in an operation period during which the clock synchronizing circuit is operated; and a clock supplying circuit that supplies a clock to the clock synchronizing circuit or stop the supply of the clock according to the enable signal when a clock frequency is equal to or lower than a predetermined frequency, and supply a clock to the clock synchronizing circuit, irrespective of the enable signal, when the clock frequency is higher than the predetermined frequency.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 is a view illustrating one example of an operation of the circuit block illustrated in FIG. 2;

FIG. 8 is a view illustrating one example of an operation of the semiconductor device illustrated in FIG. 2;

DESCRIPTION OF EMBODIMENTS

Figure 1:
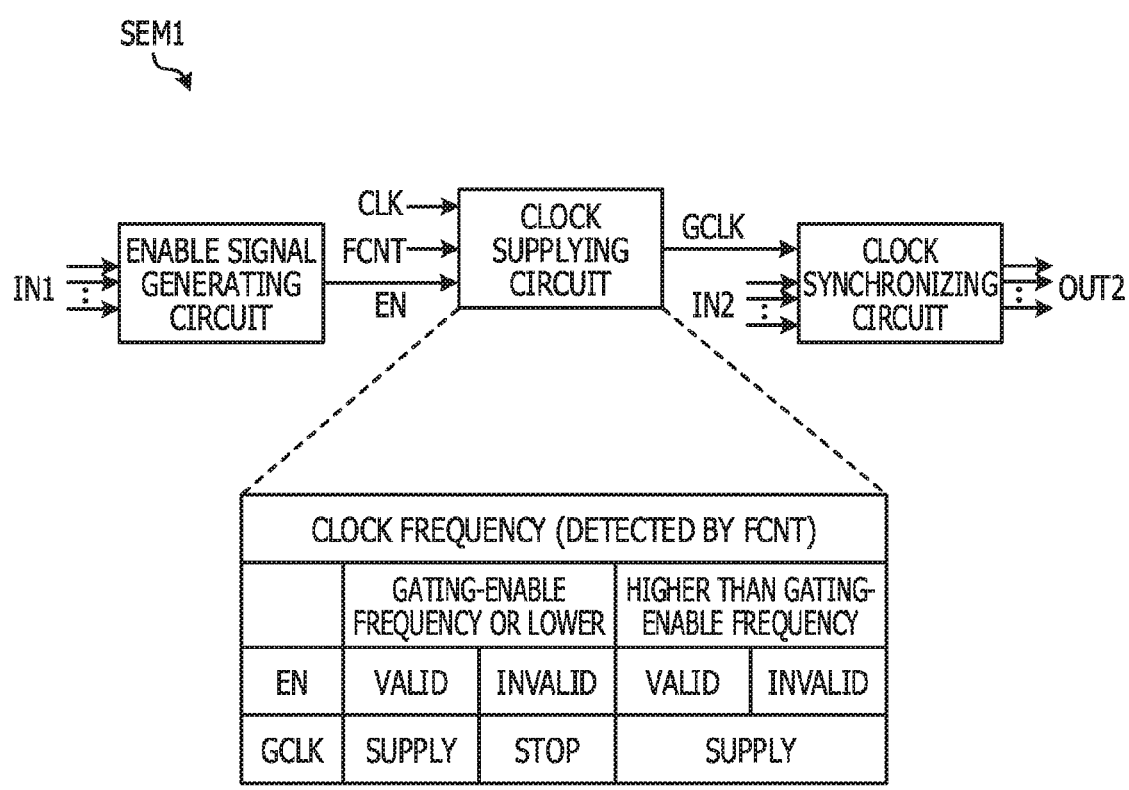
FIG. 1 is a view illustrating a semiconductor device and a method for controlling the semiconductor device according to one embodiment.

Hereinafter, embodiments will be described with reference to the accompanying drawings. The signal lines where the signals are transmitted are denoted by the same reference numerals as signal names.

FIG. 1 illustrates a semiconductor device and a method for controlling the semiconductor device according to one embodiment. Referring to FIG. 1, a semiconductor device SEM1 includes an enable signal generating circuit 1, a clock supplying circuit 2, and a clock synchronizing circuit 3.

The enable signal generating circuit 1 generates an enable signal EN when an operation period is determined during which the clock synchronizing circuit 3 is operated based on an input signal INC. The enable signal generating circuit 1 stops the generation of the enable signal EN when determining a stop period during which the operation of the clock synchronizing circuit 3 is stopped based on the input signal INC. For example, the generation of the enable signal EN indicates a change in a logic indicating a valid state of the enable signal EN, and the stop of the generation of the enable signal EN indicates a change in logic indicating an invalid state of the enable signal EN.

Based on the enable signal EN and a frequency control signal FCNT, the clock supplying circuit 2 supplies a clock CLK, as a clock GCLK, to the clock synchronizing circuit 3 or stops generation of the clock GCLK. That is, the clock supplying circuit 2 has a function of a clock gating circuit to control the supply and stop of the clock GCLK to the clock synchronizing circuit 3.

For example, timing verification at the time of design of the semiconductor device SEM1 reveals that the clock supplying circuit 2 generates a normal clock GCLK based on a logic change of the enable signal EN when the clock frequency of the clock CLK is equal to or lower than 1.6 GHz. In addition, it may be understood that the clock supplying circuit 2 may generate an abnormal clock GCLK based on a logic change of the enable signal EN when the clock frequency is higher than 1.6 GHz (an occurrence of, for example, a glitch in the clock GCLK). That is, a gating-enable frequency, which is an upper limit of clock frequency allowing the clock supplying circuit 2 to control clock gating, is 1.6 GHz. The gating-enable frequency is an example of a predetermined frequency. In addition, the timing verification reveals that the clock synchronizing circuit 3 operates at, for example, 2.0 GHz which is the maximum frequency of the clock CLK.

The frequency control signal FCNT received by the clock supplying circuit 2 exhibits different logics, for example, in a case where the clock frequency is equal to or lower than 1.6 GHz and in a case where the clock frequency is higher than 1.6 GHz. Then, based on the frequency control signal FCNT, the clock supplying circuit 2 detects whether or not the clock frequency is equal to or lower than the gating-enable frequency. When the gating-enable frequency of the clock supplying circuit 2 is 1.8 GHz, the clock supplying circuit 2 receives the frequency control signal FCNT having different logics in a case where the clock frequency is equal to or lower than 1.8 GHz and in a case where the clock frequency is higher than 1.8 GHz. The frequency control signal FCNT may be generated inside the semiconductor device SEMI. or may be supplied from the outside of the semiconductor device SEMI. The clock CLK whose frequency is dynamically changed may also be generated inside the semiconductor device SEMI. or may be supplied from the outside of the semiconductor device SEMI.

When the clock frequency is equal to or lower than the gating-enable frequency, and the enable signal EN indicates a valid state, the clock supplying circuit 2 supplies the clock GCLK synchronizing with the clock CLK to the clock synchronizing circuit 3. When the clock frequency is equal to or lower than the gating-enable frequency, and the enable signal EN indicates an invalid state, the clock supplying circuit 2 stops the supply of the clock GCLK to the clock synchronizing circuit 3. When the clock frequency is higher than the gating-enable frequency, the clock supplying circuit 2 supplies the clock GCLK to the clock synchronizing circuit 3, irrespective of the state of the enable signal EN.

The clock synchronizing circuit 3 operates in synchronization with the clock GCLK, performs, for example, an arithmetic processing based on an input signal IN2, and outputs a result of the arithmetic processing as an output signal OUT2. The semiconductor device SEMI. may include a plurality of circuit blocks, each of which includes the enable signal generating circuit 1, the clock supplying circuit 2, and the clock synchronizing circuit 3. In this case, the enable signal generating circuit 1 determines an operation period of the clock synchronizing circuit 3. The gating-enable frequency of the clock synchronizing circuit 3 is determined for each circuit block, and the clock supplying circuit 2 receives the frequency control signal FCNT corresponding to the gating-enable frequency.

As described above, in the embodiment illustrated in FIG. 1, the clock supplying circuit 2 dynamically switches whether to perform control of the clock gating, based on the relationship between the clock frequency and the gating-enable frequency. Thus, when the gating-enable frequency is equal to or lower than the clock frequency which is lower than the maximum clock frequency, it is possible to perform control of the clock gating of the clock synchronizing circuit. As a result, it is possible to reduce the power consumption of the semiconductor device SEM1 as compared to a semiconductor device which does not perform the control of the clock gating of the clock synchronizing circuit when the gating-enable frequency is lower than the maximum clock frequency.

Figure 2:
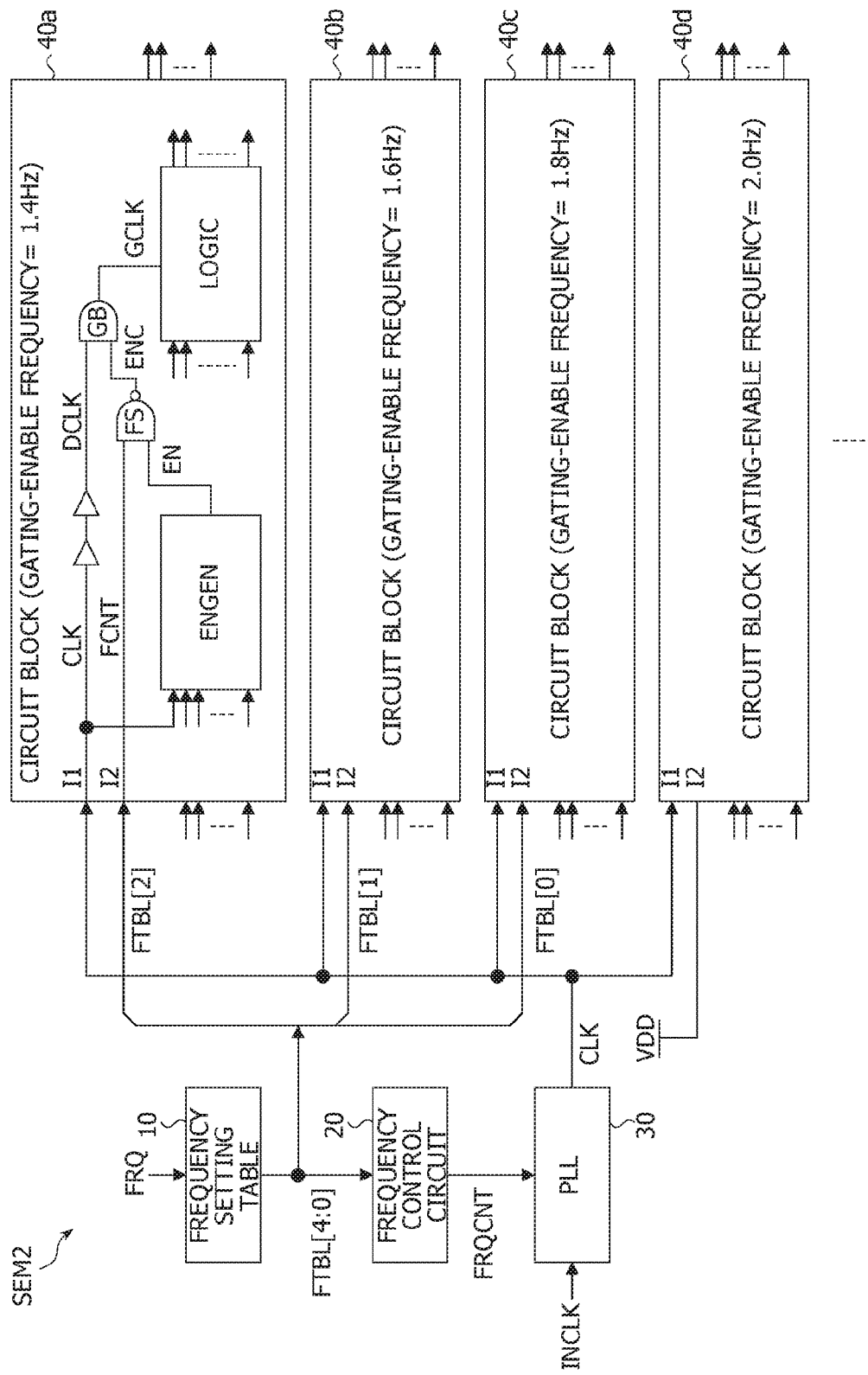
FIG. 2 is a view illustrating a semiconductor device and a method for controlling the semiconductor device according to another embodiment.

FIG. 2 is a view illustrating a semiconductor device and a method for controlling the semiconductor device according to another embodiment. Referring to FIG. 2, a semiconductor device SEM2 includes a frequency setting table 10, a frequency control circuit 20, a phase locked loop (PLL) 30, and a plurality of circuit blocks 40 (40a, 40b, 40c, and 40d). The semiconductor device SEM2 employs a dynamic frequency scaling (DFS) method which dynamically changes a frequency of a clock CLK. Although not particularly limited, the frequency of the clock CLK is dynamically changed to one of 2.0 GHz, 1.8 GHz, 1.6 GHz, 1.4 GHz, 1.2 GHz, and 1.0 GHz. Alternatively, the semiconductor device SEM2 may employ a DVFS method which dynamically changes the frequency of a clock CLK and a power supply voltage.

Figure 5:
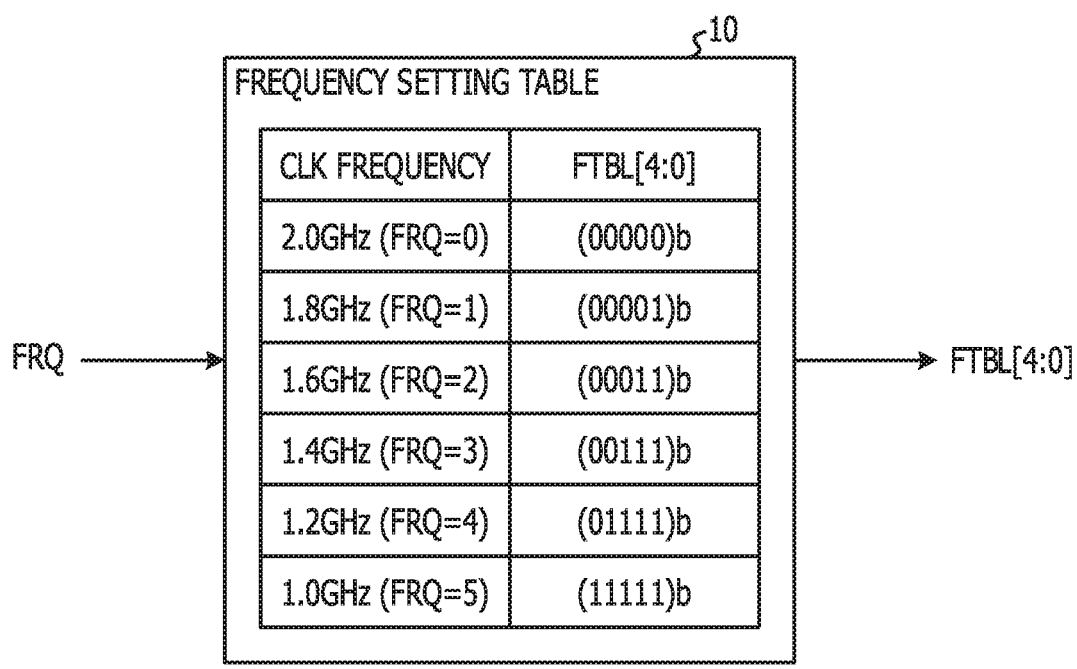
FIG. 5 is a view illustrating one example of a frequency setting table illustrated in FIG. 2.

The frequency setting table 10 outputs a 5-bit frequency signal FTBL[4:0] based on a frequency setting signal FRQ indicating a set value of the frequency of the clock CLK used in the circuit block 40. The frequency signal FTBL[4:0] is one example of frequency information having different values for different clock frequencies which may be set in the semiconductor device SEM2. An example of the frequency setting table 10 is illustrated in FIG. 5.

The frequency signal FTBL[4:0] of binary number "00000" indicates the clock CLK of 2.0 GHz, the frequency signal FTBL[4:0] of "00001" indicates the clock CLK of 1.8 GHz, the frequency signal FTBL[4:0] of "00011" indicates the clock CLK of 1.6 GHz, the frequency signal FTBL[4:0] of "00111" indicates the clock CLK of 1.4 GHz, the frequency signal FTBL[4:0] of "01111" indicates the clock CLK of 1.2 GHz, and the frequency signal FTBL[4:0] of "11111" indicates the clock CLK of 1.0 GHz. That is, the frequency setting table 10 stores the frequency information FTBL[4:0] with increase in the number of bits whose value is inverted from "0" to "1" every time the clock frequency is lowered.

Based on the frequency signal FTBL[4:0], the frequency control circuit 20 outputs a control signal FRQCNT, which causes the PLL 30 to generate the clock CLK of the frequency indicated by the frequency signal FTBL[4:0], to the PLL 30. Based on the control signal FRQCNT, the PLL 30 generates the clock CLK by multiplying or dividing a frequency of an internal clock INCLK. The PLL 30 is one example of a clock generating circuit which generates the clock CLK of the frequency indicated by the frequency signal FTBL[4:0] output from the frequency setting table 10. The clock CLK is used in common for the circuit blocks 40a, 40b, 40c, and 40d. The internal clock INCLK may be generated inside the semiconductor device SEM2 or may be supplied from the outside of the semiconductor device SEM2.

Each circuit block 40 includes an enable signal generating circuit ENGEN, an enable signal control circuit FS, a clock gating circuit GB, and a logic circuit LOGIC operating in synchronization with the clock CLK. The number of circuit blocks 40 included in the semiconductor device SEM2 is not limited to 4.

Figure 3:
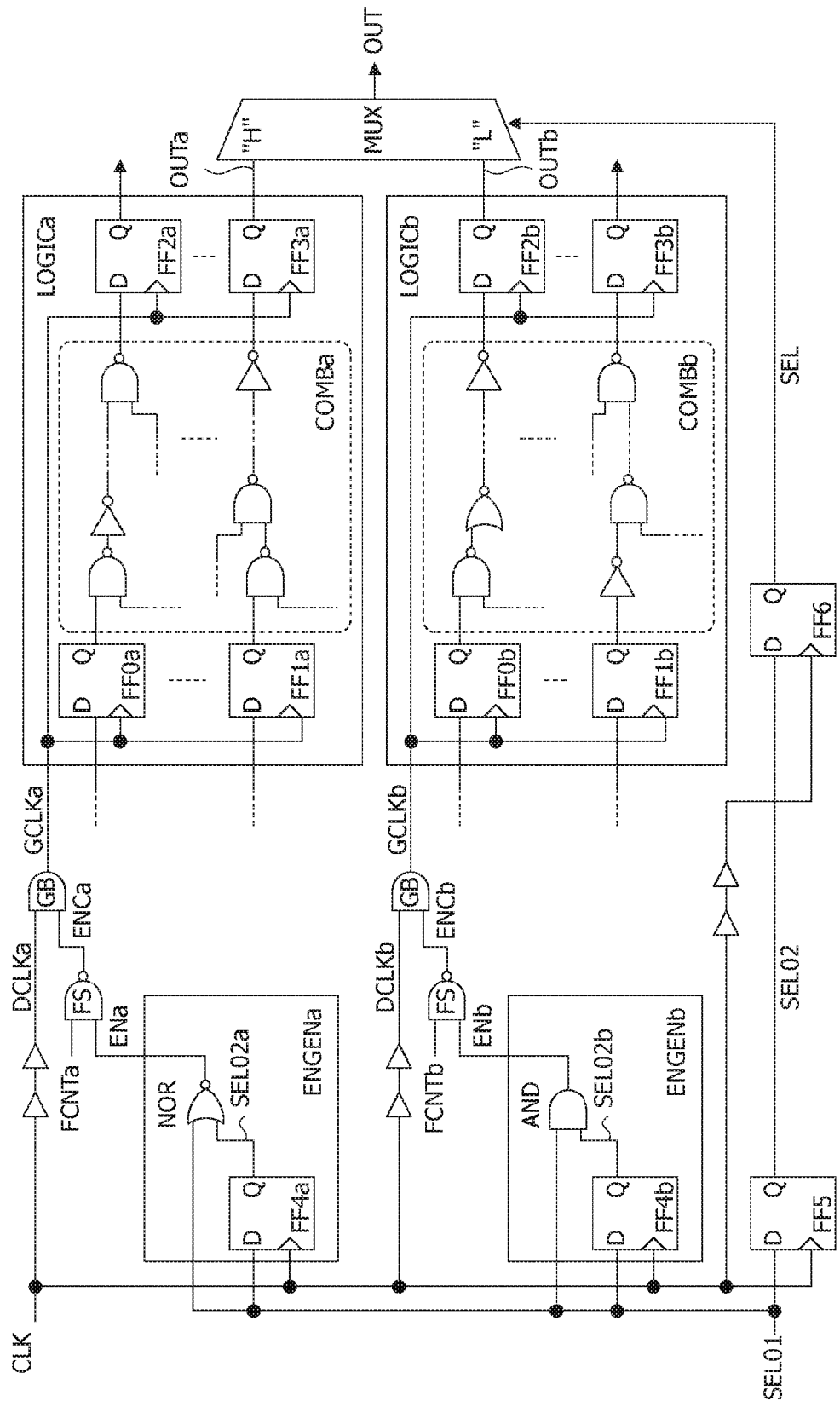
FIG. 3 is a view illustrating one example of an enable signal generating circuit and a logic circuit illustrated in FIG. 2.

The logic circuit LOGIC includes a flip-flop operating in synchronization with the clock GCLK, and a combinational circuit connected to the flip-flop. The logic circuit LOGIC is one example of a clock synchronizing circuit operating in synchronization with the clock GCLK. An example of the logic circuit LOGIC is illustrated in FIG. 3. The logic circuit LOGIC has different operation and stop conditions for different circuit blocks 40.

For example, the logic circuit LOGIC is operated when a signal generated in and output to the outside of the logic circuit LOGIC is used in a different circuit, and is stopped when the signal generated in the logic circuit LOGIC is not used in the different circuit. The operation of the logic circuit LOGIC is stopped when the clock GCLK supplied to the logic circuit GCLK is stopped. That is, each logic circuit LOGIC is operated or stopped by the control of the clock gating for controlling the supply or stop of the clock GCLK. The control of the clock gating is performed by the enable signal generating circuit ENGEN, the enable signal control circuit FS, and the clock gating circuit GB.

Figure 6:
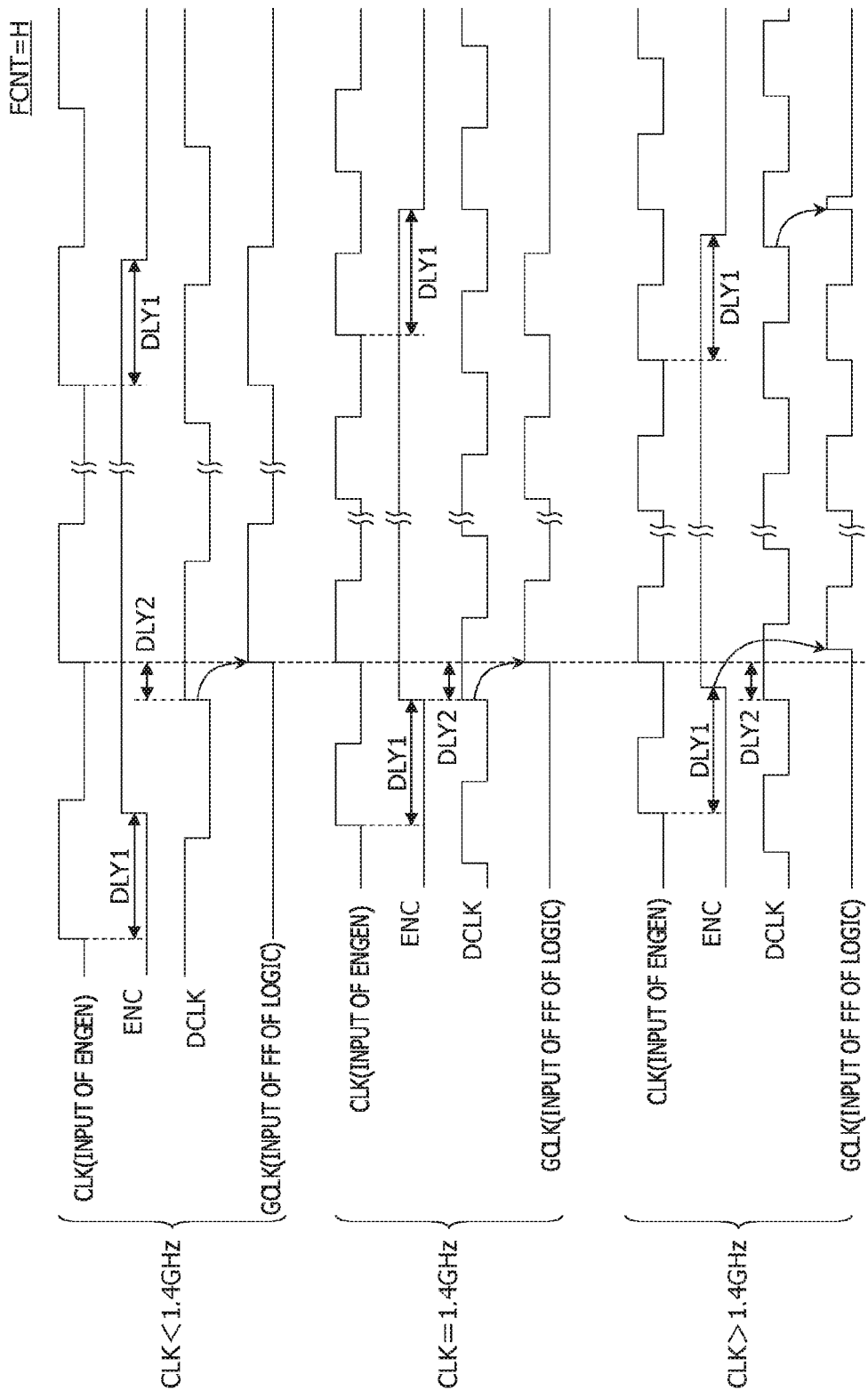
FIG. 6 is a view illustrating one example of a generation timing of a clock supplied to a logic circuit of a circuit block 40a illustrated in FIG. 2.

As illustrated in FIG. 6, whether or not the control of the clock gating in each circuit block 40 is possible is determined depending on the frequency of the clock CLK. The frequency of the clock CLK making the control of the clock gating in each circuit block 40 possible is determined by timing verification at the time of design of the semiconductor device SEM2. In the following description, the frequency of the clock CLK making the control of the clock gating possible is referred to as a gating-enable frequency.

Each circuit block 40 receives a bit value of the frequency signal FTBL[4:0], which corresponds to the gating-enable frequency determined by the timing verification at the time of design, as a frequency control signal FCNT. That is, a signal line transmitting the bit value of the frequency signal FTBL[4:0], which is connected to each circuit block 40, is wired based on a result of the timing verification. The conditions (logic of the enable signal EN) of operating or stopping each logic circuit LOGIC are determined based on determination by the enable signal generating circuit ENGEN and logic of the frequency control signal FCNT.

The enable signal generating circuit ENGEN operates in synchronization with the clock CL, sets the enable signal EN to a valid level in a period during which the logic circuit LOGIC is operated, and sets the enable signal EN to an invalid level in a period during which the logic circuit LOGIC is stopped. For example, the invalid level of the enable signal EN is a low level, and the invalid level of the enable signal EN is a high level. The enable signal generating circuit ENGEN determines the operation period and the stop period of the logic circuit LOGIC based on the logic of an input signal. An example of the enable signal generating circuit ENGEN is illustrated in FIG. 3.

The enable signal control circuit FS inverts the logic of the enable signal EN when the frequency control signal FCNT has a high level, and outputs it as a clock control signal ENC. When the frequency control signal FCNT has a low level, the enable signal control circuit FS sets the clock control signal ENC to a high level, irrespective of the logic of the enable signal EN. That is, when the frequency control signal FCNT has the high level, the enable signal control circuit FS outputs the clock control signal ENC in a valid state or an invalid state based on the enable signal EN. For example, the clock control signal ENC having the high level indicates the valid state, and the clock control signal ENC having the low level indicates the invalid state. When the frequency control signal FCNT has the low level, the enable signal control circuit FS sets the clock control signal ENC to the valid state. For example, the enable signal control circuit FS includes an NAND gate.

When the clock control signal ENC has the high level (valid state), the clock gating circuit GB outputs a clock DCLK, which is obtained by delaying the clock CLK by means of, for example, a buffer circuit (indicated by a triangle in the figure), as the clock GCLK to the logic circuit LOGIC. When the clock control signal ENC has the low level (invalid state), the clock gating circuit GB stops the output of the clock GCLK. For example, the clock gating circuit GB includes an AND gate. The enable signal control circuit FS and the clock gating circuit GB are one example of a clock supplying circuit.

In FIG. 2, the enable signal control circuit FS making the control of the clock gating valid or invalid depending on the clock frequency is added to a path transmitting the enable signal EN output from the enable signal generating circuit ENGEN to the clock gating circuit GB. Thus, the semiconductor device SEM2 for implementing the operation illustrated in FIGS. 7 and 8 may be designed by reformation of existing design data. For example, in the existing design data, the enable signal EN output from the enable signal generating circuit ENGEN is directly supplied to the clock gating circuit GB.

The gating-enable frequency of the circuit block 40a is 1.4 GHz, and the frequency control signal FCNT received in the circuit block 40a has the same logic as the bit FTBL[2] of the frequency signal FTBL[4:0] output from the frequency setting table 10. When the bit FTBL[2] has a low level, the frequency of the clock CLK is 2.0 GHz, 1.8 GHz, or 1.6 GHz. When the bit FTBL[2] has a high level, the frequency of the clock CLK is 1.4 GHz, 1.2 GHz, or 1.0 GHz. Therefore, when the frequency of the clock CLK is equal to or higher than 1.6 GHz, the enable signal control circuit FS of the circuit block 40a fixes the clock control signal ENC to a high level. When the frequency of the clock CLK is equal to or lower than 1.4 GHz, the enable signal control circuit FS of the circuit block 40a inverts the logic of the enable signal EN and outputs it as the clock control signal ENC.

The gating-enable frequency of the circuit block 40b is 1.6 GHz, and the enable signal control circuit FS of the circuit block 40b receives the logic of the bit FTBL[1] of the frequency signal FTBL[4:0] as the frequency control signal FCNT. The gating-enable frequency of the circuit block 40c is 1.8 GHz, and the enable signal control circuit FS of the circuit block 40c receives the logic of the bit FTBL[0] of the frequency signal FTBL[4:0] as the frequency control signal FCNT.

Meanwhile, the gating-enable frequency of the circuit block 40d is 2.0 GHz, and the clock gating may be controlled at any frequencies. Therefore, the enable signal control circuit FS of the circuit block 40d receives a high level (e.g., a power supply voltage VDD) as the frequency control signal FCNT. Then, irrespective of the frequency of the clock CLK, the enable signal control circuit FS of the circuit block 40d inverts the logic of the enable signal EN generated by the enable signal generating circuit ENGEN and outputs it as the clock control signal ENC. Accordingly, irrespective of the frequency of the clock CLK, the clock gating circuit GB supplies the clock GCLK to the logic circuit LOGIC or stops the supply of the clock GCLK depending on the logic of the enable signal EN. As in other circuit blocks 40a, 40b, and 40c, when the enable signal control circuit FS is included in the circuit block 40d whose gating-enable frequency is 2.0 GHz which is the maximum frequency, some of the circuit block 40 may be in common. Accordingly, it is possible to simplify logic design and timing verification as compared to when the enable signal control circuit FS is not included in the circuit block 40d.

FIG. 3 illustrates one example of the enable signal generating circuit ENGEN and the logic circuit LOGIC illustrated in FIG. 2. In FIG. 3, signals and circuits denoted by reference numerals, each of which has a suffix "a," are included in the circuit block 40a illustrated in FIG. 2, and signals and circuits denoted by reference numerals, each of which has a suffix "b," are included in the circuit block 40b illustrated in FIG. 2.

In the example illustrated in FIG. 3, an enable signal generating circuit ENGENa includes a flip-flop FF4a and an NOR gate NOR, and an enable signal generating circuit ENGENb includes a flip-flop FF4b and an AND gate AND.

A logic circuit LOGICa includes flip-flops FF0a, FF1a, FF2a, and FF3a and a combinational circuit COMBa. A logic circuit LOGICb includes flip-flops FF0b, FF1b, FF2b, and FF3b and a combinational circuit COMBb.

The logic circuit LOGICa uses the combinational circuit COMBa to perform an arithmetic operation for the data received in the flip-flops FF0a and FF1a within 1 clock cycle and outputs a result of the arithmetic operation from the flip-flops FF2a and FF3a in synchronization with the next clock cycle. Likewise, the logic circuit LOGICb uses the combinational circuit COMBb to perform an arithmetic operation for data received in the flip-flops FF0b and FF1b within 1 clock cycle and outputs a result of the arithmetic operation from the flip-flops FF2b and FF3b in synchronization with the next clock cycle.

In addition, the semiconductor device SEM2 includes flip-flops FF5 and FF6 and a multiplexer MUX. The flip-flop FF5 outputs a select signal SEL01, as a select signal SEL02, to the flip-flop FF6 in synchronization with the clock CLK. The flip-flop FF6 outputs the select signal SEL02, as a select signal SEL, to the multiplexer MUX in synchronization with the clock CLK. Between the flip-flops FF5 and FF6 is interposed a buffer circuit (indicated by a triangle in the figure) for arranging phases of clocks CLK supplied to the flip-flops FF5 and FF6. The select signals SEL01, SEL02, and SEL are sequentially set to a high level when operating the logic circuit LOGICa and stopping the operation of the logic circuit LOGICb. In addition, the select signals SEL01, SEL02, and SEL are sequentially set to a low level when operating the logic circuit LOGICb and stopping the operation of the logic circuit LOGICa. In other words, the select signals SEL01, SEL02, and SEL are generated to operate the logic circuits LOGICa and LOGICb exclusively.

The multiplexer MUX selects an output signal OUTa output by the logic circuit LOGICa in a period during which the select signal SLE having a high level H is received, and outputs the selected output signal OUTa as an output signal OUT. In addition, the multiplexer MUX selects an output signal OUTb output by the logic circuit LOGICb in a period during which the select signal SLE having a low level L is received, and outputs the selected output signal OUTb as an output signal OUT.

The flip-flop FF4a of the enable signal generating circuit ENGENa receives the select signal SEL01 in synchronization with the clock CLK and outputs it, as a select signal SEL02a, to the NOR gate NOR. The NOR gate NOR sets an enable signal ENa to a low level in a period during which the select signal SEL01 or the select signal SEL02a has a high level, and sets the enable signal ENa to a high level in a period during which both of the select signals SEL01 and SEL02a have a low level.

The flip-flop FF4b of the enable signal generating circuit ENGENb receives the select signal SEL01 in synchronization with the clock CLK and outputs it, as a select signal SEL02b, to the AND gate AND. The AND gate AND sets an enable signal ENb to a low level in a period during which the select signal SEL01 or the select signal SEL02b has a low level, and sets the enable signal ENb to a high level in a period during which both of the select signals SEL01 and SEL02b have a high level. In addition, the select signals SEL02a and SEL02b are generated in synchronization with the select signal SEL02 output by the flip-flop FF5.

Figure 4:
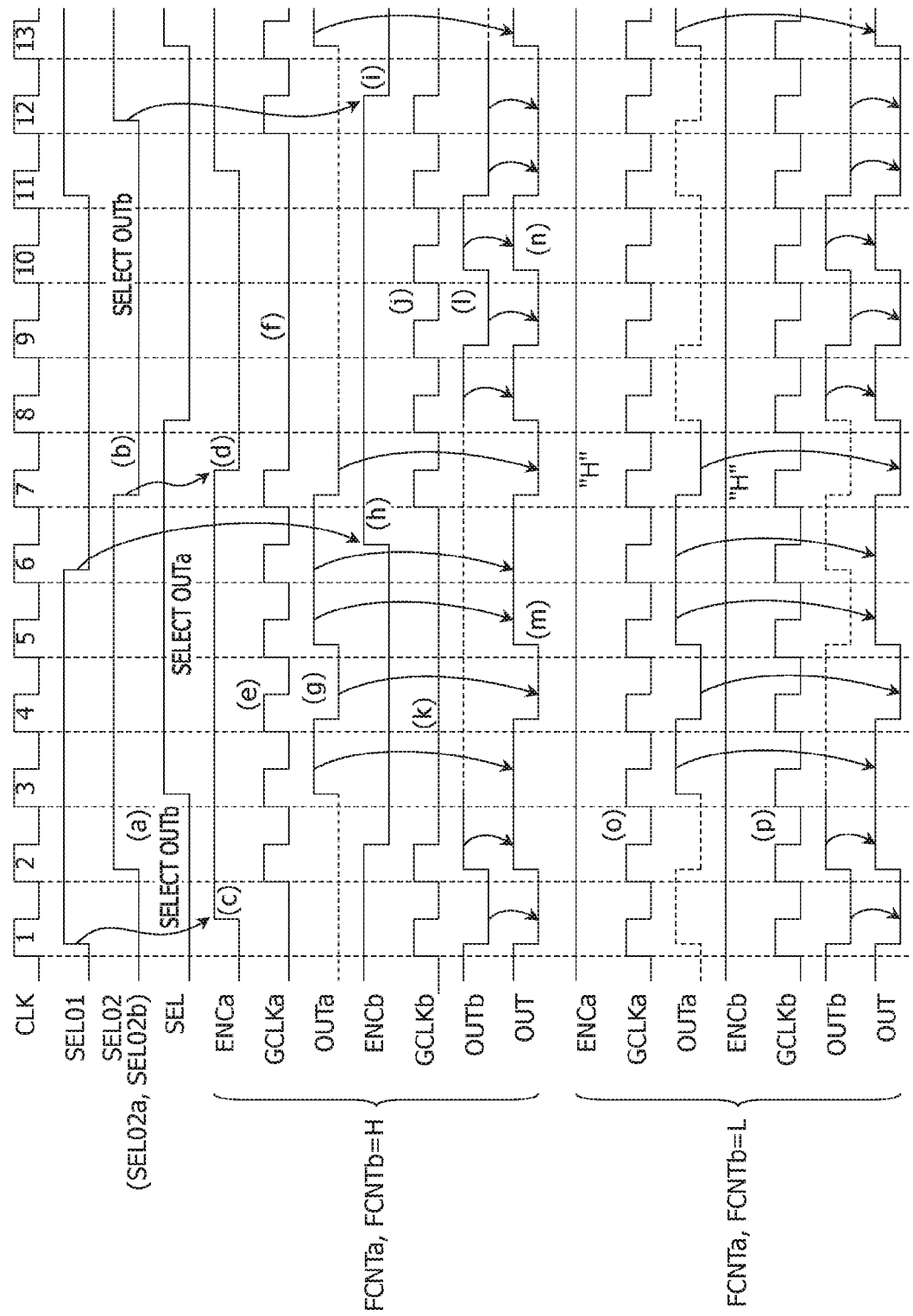
FIG. 4 is a view illustrating one example of an operation of the enable signal generating circuit and the logic circuit illustrated in FIG. 3.

FIG. 4 is a view illustrating one example of an operation of the enable signal generating circuits ENGENa and ENGENb and the logic circuits LOGICa and LOGICb illustrated in FIG. 3. Waveforms obtained when the frequency control signals FCNTa and FCNTb are set to a high level H represent examples of the operation when the clock gating control is set to be valid. A waveform obtained when the frequency control signals FCNTa and FCNTb are set to a low level L represents an example of an operation when the clock gating control is set to be invalid.

The select signals SEL01, SEL02 (SEL02a and SEL02b), and SEL are sequentially generated in synchronization with the clock CLK, irrespective of invalidity/validity of the clock gating control (see (a) and (b) in FIG. 4).

When the clock gating control is set to be valid, an enable signal ENCa is changed to a high level (valid level) in synchronization with a rising edge of the select signal SEL01 (see (c) in FIG. 4). In addition, the enable signal ENCa is changed to a low level (invalid level) in synchronization with a falling edge of the select signal SEL02a (see (d) in FIG. 4). A clock GCLKa is generated in synchronization with the clock CLK in a period during which the enable signal ENCa has the high level, and the generation of the clock GCLKa is stopped in a period during which the enable signal ENCa has the low level (see (e) and (f) in FIG. 4). The logic circuit LOGICa operates in synchronization with the clock GCLKa, generates the output signal OUTa, and sequentially outputs the generated output signal OUTa in synchronization with a rising edge of the clock GCLKa (see (g) in FIG. 4). A waveform (indicated by a dashed line) of the output signal OUTa indicates that the logic circuit LOGICa holds logic of the output signal OUTa by the stop of the clock GCLKa.

When the clock gating control is set to be valid, an enable signal ENCb is changed to a high level (valid level) in synchronization with the falling edge of the select signal SEL01 (see (h) in FIG. 4). In addition, the enable signal ENCb is changed to a low level (invalid level) in synchronization with a rising edge of the select signal SEL02b (see (i) in FIG. 4). A clock GCLKb is generated in synchronization with the clock CLK in a period during which the enable signal ENCb has the high level, and the generation of the clock GCLKb is stopped in a period during which the enable signal ENCb has the low level (see (j) and (k) in FIG. 4). The logic circuit LOGICb operates in synchronization with the clock GCLKb, generates the output signal OUTb, and sequentially outputs the generated output signal OUTb in synchronization with a rising edge of the clock GCLKb (see (l) in FIG. 4). A waveform (indicated by a dashed line) of the output signal OUTb indicates that the logic circuit LOGICb holds logic of the output signal OUTb by the stop of the clock GCLKb.

The multiplexer MUX outputs the output signal OUTa as the output signal OUT in a period during which the select signal SEL has the high level, and outputs the output signal OUTb as the output signal OUT in a period during which the select signal SEL has the low level (see (m) and (n) in FIG. 4). By setting the clock gating control to be valid and stopping one of the clocks GCLKa and GCLKb supplied to the logic circuits LOGICa and LOGICb, it is possible to reduce the power consumption as compared to when the clock gating control is not performed.

In addition, in consideration of a period (one clock cycle) during which each of the logic circuits LOGICa and LOGICb performs an arithmetic operation, each of the clocks GCLKa and GCLKb begins to be generated one clock cycle before switching of the select signal SEL. In addition, in order to hold the output signals OUTa and OUTb, the clocks GCLKa and GCLKb are stopped to conform to the switching of the select signal SEL. In order to generate/stop the clocks GCLKa and GCLKb, the clock control signals ENCa and ENCb are changed to a high level two clock cycles before the switching of the select signal SEL and changed to a low level one clock cycle before the switching of the select signal SEL. In addition, as illustrated in FIG. 3, in order to generate the clock control signal ENCa, the enable signal generating circuit ENGENa including the flip-flop FF4a and the NOR gate NOR is provided. In addition, in order to generate the clock control signal ENCb, the enable signal generating circuit ENGENb including the flip-flop FF4b and the AND gate AND is provided.

Meanwhile, when the clock gating control is set to be invalid (FCNTa and FNCTb=L), the clocks GCLKa and GCLKb are generated, irrespective of the logic of the select signal SEL (see (o) and (p) in FIG. 4). The flip-flops FF of the logic circuits LOGICa and LOGICb always operate in synchronization with the clocks GCLKa and GCLKb. The multiplexer MUX operates in the same manner as when the clock gating control is set to be valid. In the waveforms obtained when the frequency control signals FCNTa and FCNTb are set to the low level L, waveforms of the output signals OUTa and OUTb indicated by dashed lines indicate invalid data.

FIG. 4 also illustrates an example of simultaneous performance of switching between validity and invalidity of the clock gating control in the logic circuits LOGICa and LOGICb. However, the switching between validity and invalidity of the clock gating control may be performed independently in the logic circuits LOGICa and LOGICb.

FIG. 5 is a view illustrating one example of the frequency setting table 10 illustrated in FIG. 2. The frequency setting table 10 has six storage areas storing the logic of the frequency signal FTBL[4:0] in correspondence to six frequencies (2.0 GHz, 1.8 GHz, 1.6 GHz, 1.4 GHz, 1.2 GHz, and 1.0 GHz) of the clock CLK. The frequency setting table 10 selects one of the storage areas based on a frequency setting signal FRQ (e.g., "0" to "5" in decimal) designating one of the six clock frequencies. Then, the frequency setting table 10 outputs a 5-bit frequency signal FTBL[4:0] stored in the selected storage area.

As illustrated in FIG. 2, the enable signal control circuit FS uses the frequency signal FTBL[4:0] setting the frequency of the clock CLK generated by the PLL 30 to control generation of the clock control signal ENC. In addition, the enable signal control circuit FS receives one bit value in the frequency signal FTBL[4:0] with increase in the number of bits whose value is inverted from "0" to "1" every time the clock frequency is lowered, as the frequency control signal FCNT. That is, the enable signal control circuit FS receives a bit value FTBL[i] (i is one of 4, 3, 2, 1, and 0) of the frequency signal FTBL[4:0] whose logic is inverted with a gating-enable frequency as a boundary. Thus, when the bit value FTBL[i] of the frequency signal FTBL[4:0] is coupled to an input of the enable signal control circuit FS, it is possible to control the generation of the clock control signal ENC. As a result, it is possible to simplify the design of the semiconductor device SEM2 as compared to a case where a new circuit is used to generate a control signal for controlling the generation of the clock control signal ENC.

FIG. 6 illustrates one example of a generation timing of the clock GCLK supplied to the logic circuit LOGIC of the circuit block 40a illustrated in FIG. 2. In the circuit block 40a, the gating-enable frequency, which is the frequency of the clock CLK allowing the clock gating control, is 1.4 GHz. In FIG. 6, it is assumed that the frequency control signal FCNT is set to a high level, irrespective of the clock frequency, and the clock gating circuit GB outputs the clock CLK as the clock GCLK.

The enable signal generating circuit ENGEN receives an input signal in synchronization with a rising edge of the clock CLK, and then, changes the enable signal EN (not illustrated) to a high level or a low level after a delay time DLY1. The delay time DLY1 is an operation time of a combinational circuit within the enable signal generating circuit ENGEN. A delay time DLY2 is a propagation delay time of a signal line which transmits the clock GCLK from the clock gating circuit GB to the flip-flop FF of the logic circuit LOGIC. Therefore, the delay times DLY1 and DLY2 do not depend on the frequency of the clock CLK. The clock gating circuit GB receives a clock DCLK which has a phase earlier by the delay time DLY2 than the clock CLK. Thus, a clock input of the flip-flop FF of the logic circuit LOGIC receives the clock GCLK having the same phase as the phase of the clock CLK. In addition, the phase of the clock DCLK with respect to the clock CLK is adjusted by, for example, a buffer circuit (indicated by a triangle in FIG. 2).

In the upper and middle waveforms in FIG. 6, the sum of the delay times DLY1 and DLY2 is equal to or less than one cycle of the clock CLK. In this case, the flip-flop FF of the logic circuit LOGIC may receive the clock GCLK having the same phase as the phase of the clock CLK in a period during which the clock control signal ENC has a high level, and the logic circuit LOGIC operates normally. That is, the timing constraint of the clock control signal ENC on the clock signal CLK is satisfied.

Meanwhile, when the sum of the delay times DLY1 and DLY2 is more than one cycle of the clock CLK (see the lower waveform in FIG. 6), a transition edge of the clock control signal ENC is later than a rising edge of the clock DCLK. Therefore, the phase of a rising edge of the clock GCLK when the clock control signal ENC is changed to the high level is later than the phase of the rising edge of the clock CLK. In addition, when the clock control signal ENC is changed to the low level, there is a possibility that a hazard occurs in the clock GCLK. That is, in the lower waveform in FIG. 6, the timing constraint of the clock control signal ENC on the clock signal CLK is unsatisfied, and there is a possibility that the logic circuit LOGIC malfunctions.

In order to avoid such malfunctioning, in the circuit block 40*a* illustrated in FIG. 2, when the clock frequency is higher than 1.4 GHz, based on a logic of a frequency signal FTBL[2], the frequency control signal FCNT is set to a low level, and the clock gating control is set to be invalid. When the clock gating control is set to be invalid, the clock control signal ENC is fixed to a high level, irrespective of the clock frequency, and the clock GCLK having the same phase as the phase of the clock CLK is always generated.

In this way, the clock frequency (i.e., the gating-enable frequency) making the clock gating control valid or invalid is set for each circuit block 40 based on a timing margin of the enable signal control circuit FS and the clock gating circuit GB. Depending on the electrical characteristics of the circuit block 40, when the clock frequency making the clock gating control valid or invalid is set for each circuit block 40, it is possible to reduce power consumption of the semiconductor device SEM2, as described with reference to FIGS. 7 and 8.

FIG. 7 illustrates one example of the operation of the circuit block 40 illustrated in FIG. 2. In the six clock frequencies, a shadowed circuit block 40 indicates that the clock gating control is valid, and the clock control signal ENC is changed to a low level L or a high level H based on the operation of the enable signal generating circuit ENGEN. A frequency illustrated in brackets in the left-most column of FIG. 7 indicates the gating-enable frequency. In the six clock frequencies, a white circuit block 40 indicates that the clock control signal ENC is fixed to a high level by the frequency control signal FCNT having a low level L. When the clock control signal ENC is fixed to the high level H, the clock gating control is invalid, and the clock GCLK is always generated in synchronization with the clock CLK.

When the frequency of the clock CLK is equal to or lower than the gating-enable frequency, each circuit block 40 performs the clock gating control. In this case, power consumption of the circuit block 40 in a period during which the clock control signal ENC has the low level L may be reduced as compared to power consumption of the circuit block 40 in a period during which the clock control signal ENC has the high level H.

Meanwhile, in the circuit blocks 40 except for the circuit block 40*d* whose gating-enable frequency is 2.0 GHz, when the frequency of the clock CLK is higher than the gating-enable frequency, the clock gating control is set to be invalid. In this case, since the clock control signal ENC is fixed to a high level H, and the clock GCLK is always generated, the power consumption of the circuit block 40 is increased as compared to when the clock gating control is set to be valid.

However, the semiconductor device SEM2 sets the clock gating control to be valid or invalid for each circuit block 40 depending on the frequency of the clock CLK. This makes it possible to reduce the power consumption of the semiconductor device SEM2 as compared to a case where the gating-enable frequency is evenly set to be invalid in circuit blocks whose gating-enable frequency is lower than the highest frequency of the clock CLK (see, e.g., FIG. 9).

FIG. 8 illustrates one example of the operation of the semiconductor device SEM2 illustrated in FIG. 2. FIG. 8 illustrates 4 circuit blocks 40 (40*a*, 40*b*, 40*c*, and 40*d*) for respective common gating-enable frequencies. In FIG. 8, a hatched rectangle indicates a period during which the clock control signal ENC is set to a low level L, and the supply of the clock GCLK to the logic circuits LOGIC in the circuit blocks 40 is stopped. A white rectangle indicates a period during which the clock control signal ENC is set to a high level H, and the clock GCLK is supplied to the logic circuits LOGIC within the circuit blocks 40.

Each of four circuit blocks 40*a*(1) to 40*a*(4) whose gating-enable frequency is 1.4 GHz sets the clock gating control to be invalid in a period during which the frequency of the clock CLK is set to 2.0 GHz, 1.8 GHz, or 1.6 GHz. Each of four circuit blocks 40*b*(1) to 40*b*(4) whose gating-enable frequency is 1.6 GHz sets the clock gating control to be invalid in a period during which the frequency of the clock CLK is set to 2.0 GHz or 1.8 GHz. Each of four circuit blocks 40*c*(1) to 40*c*(4) whose gating-enable frequency is 1.8 GHz sets the clock gating control to be invalid in a period during which the frequency of the clock CLK is set to 2.0 GHz. By invalidating the clock gating control, the clock control signal ENC is fixed to the high level H, irrespective of the logic of the enable signal EN illustrated in FIG. 2, and the clock GCLK is supplied to the logic circuits LOGIC even in a period during which the logical circuits LOGIC do not operate. FIG. 8 illustrates that each circuit block 40 has a clock frequency for performing the clock gating control in order to reduce power consumption.

Figure 9:
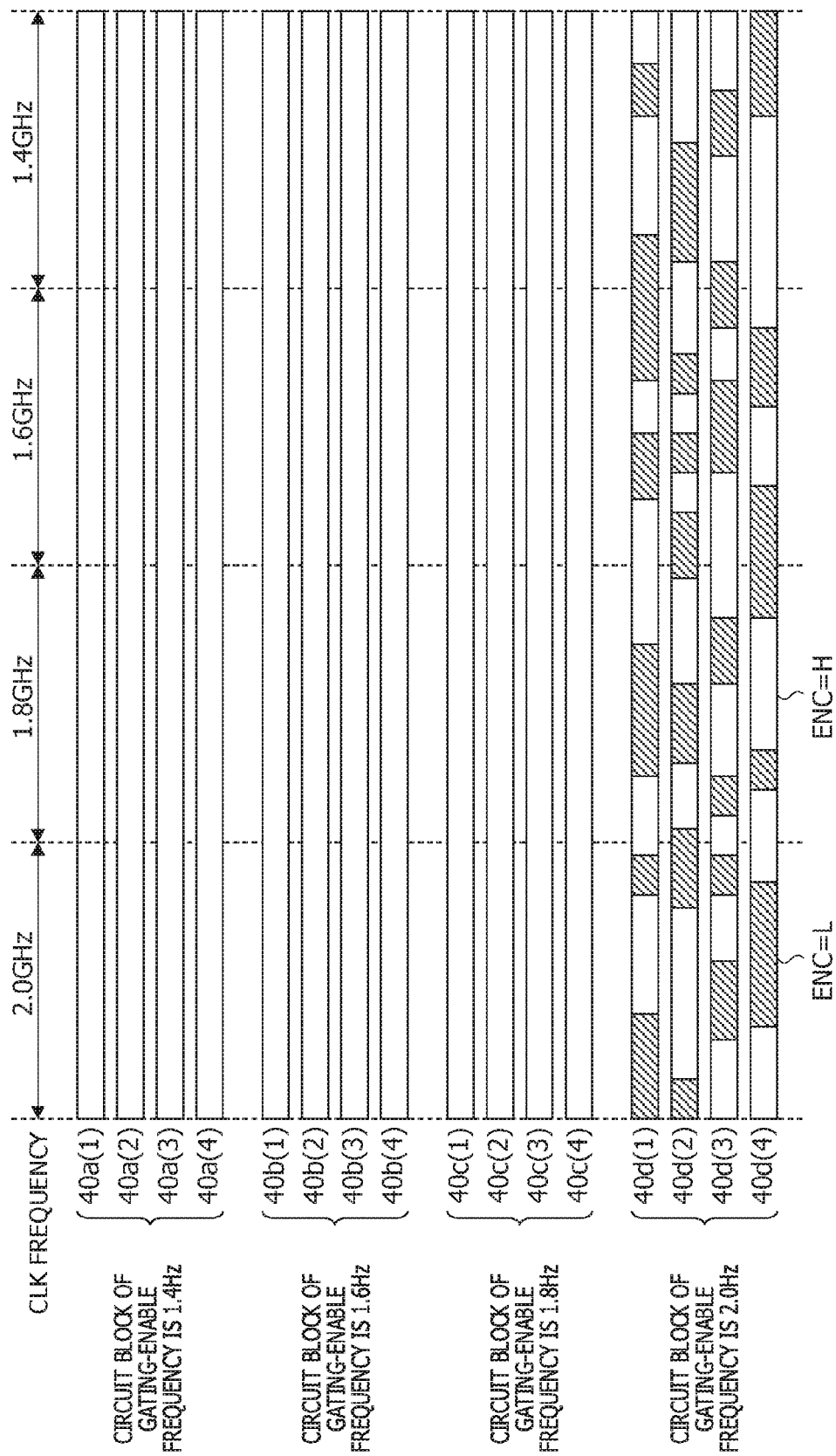
FIG. 9 is a view illustrating one example of an operation of a semiconductor device including no enable signal control circuit.

FIG. 9 illustrates one example of an operation of a semiconductor device having no enable signal control circuit FS. In FIG. 9, detailed explanation about the same operation as that in FIG. 8 is omitted.

In FIG. 9, the clock gating control is evenly set to be invalid in the circuit blocks 40*a*, 40*b*, and 40*c* whose gating-enable frequency is lower than the highest frequency (2.0 GHz in this example) of the clock CLK. Therefore, irrespective of the frequency of the clock CLK, each of the flip-flops FF of the logic circuits LOGIC of the circuit blocks 40a, 40b, and 40c receives the clock GCLK even in a period during which the logic circuits LOGIC do not operate.

In FIGS. 8 and 9, a region indicated by a hatched rectangle indicates a period during which the supply of the clock CLK to the logic circuits LOGIC is stopped to reduce power consumption. That is, it is understood from FIGS. 8 and 9 that the sum of the number of regions indicated by a hatched rectangle and periods indicated by the regions corresponds to the amount of reduction of power consumption, and the power consumption of the semiconductor device SEM2 illustrated in FIG. 8 is smaller than the power consumption of the semiconductor device illustrated in FIG. 9.

Figure 10:
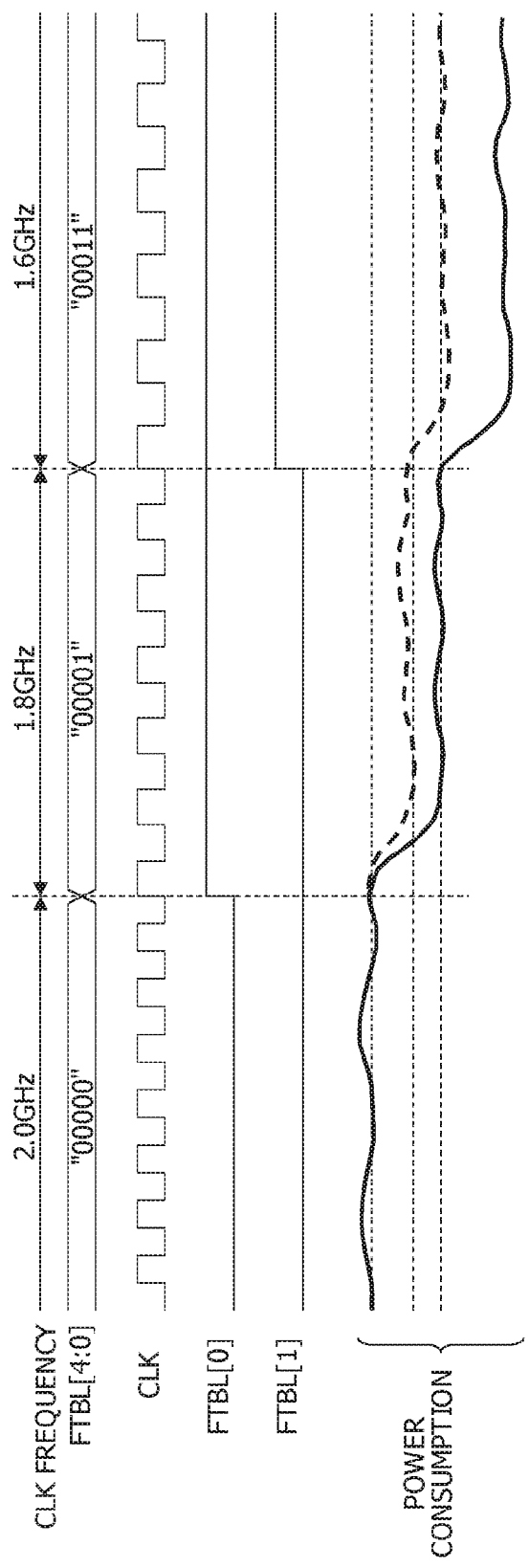
FIG. 10 is a view illustrating one example of a change in power consumption by a clock frequency of the semiconductor device illustrated in FIG. 2.

FIG. 10 illustrates one example of a change in power consumption by the clock frequency of the semiconductor device SEM2 illustrated in FIG. 2. A thick solid line indicates a change in power consumption of the semiconductor device SEM2, and a thick dashed line indicates a change in power consumption of a semiconductor device which does not include the enable signal control circuit FS (FIG. 2).

In the semiconductor device which does not include the enable signal control circuit FS, the power consumption is reduced every time the frequency of the clock CLK is stepped down by a DFS method of dynamically changing the frequency of the clock CLK. In contrast, in the semiconductor device SEM2 illustrated in FIG. 2, the power consumption is further reduced as the number of circuit blocks 40 making the clock gating control valid is increased every time the frequency of the clock CLK is stepped down. That is, in the semiconductor device SEM 2, as illustrated in FIG. 8, since the number of circuit blocks 40 indicated by a hatched rectangle in which the supply of the clock GCLK is stopped is increased with decrease in the frequency of the clock CLK, the power consumption may be further reduced.

Figure 11:
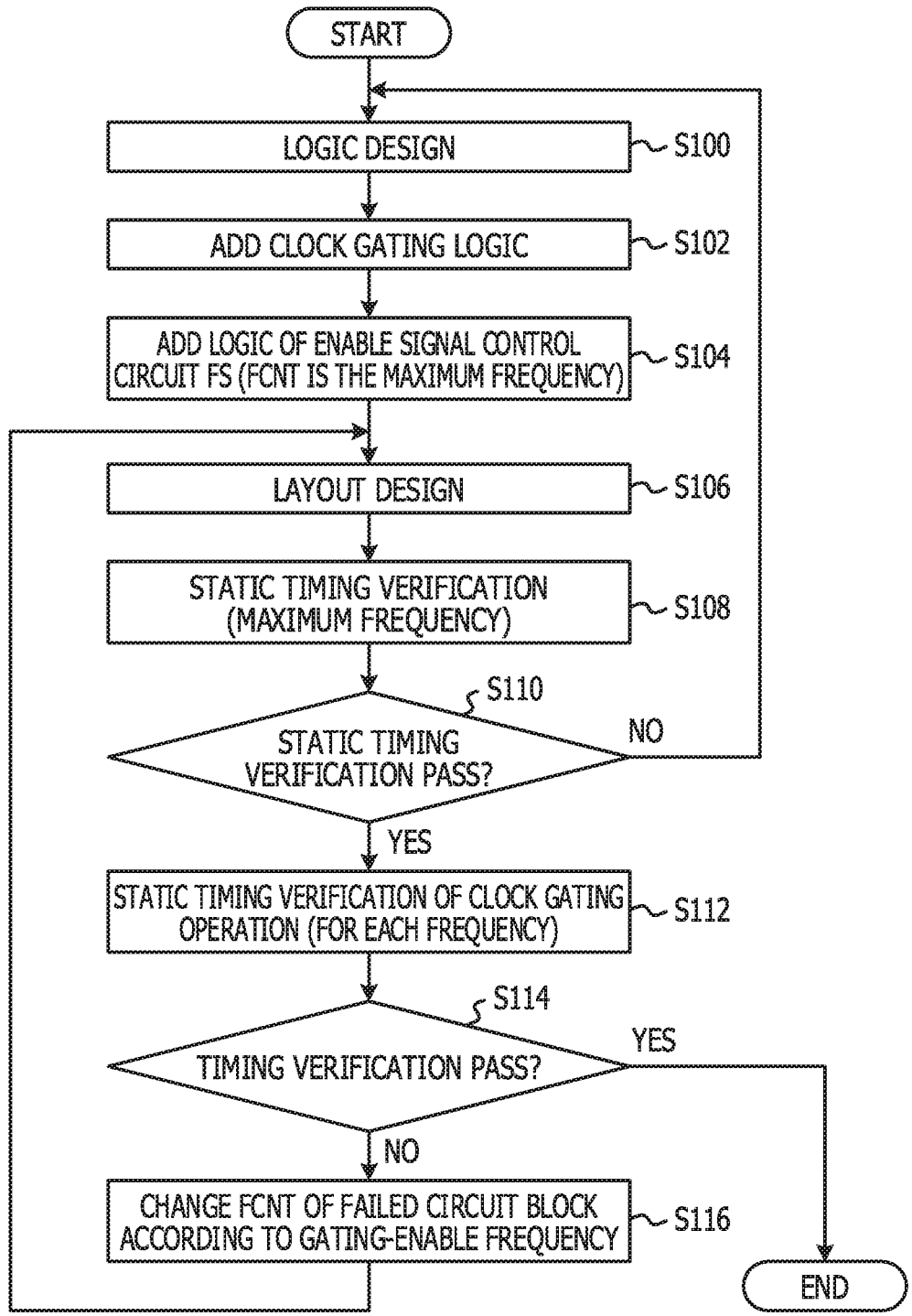
FIG. 11 is a view illustrating one example of a design flow of the semiconductor device illustrated in FIG. 2.

FIG. 11 illustrates one example of a design flow of the semiconductor device SEM2 illustrated in FIG. 2. The process illustrated in FIG. 11 is performed using a logic design tool, a layout design tool, and a timing verification tool.

First, at Step S100, a logic design of, for example, logic circuits LOGIC for implementing the function of the semiconductor device SEM2 is performed. Next, at Step S102, a clock gating logic for implementing a clock gating control of, for example, the enable signal generating circuit ENGEN and the clock gating circuit GB is added to the logic which has completed the logic design. Next, at Step S104, a logic of the enable signal control circuit FS setting the clock gating control to be valid or invalid according to the frequency of the clock CLK is inserted into the logic added with the clock gating logic. At this time, since static timing verification at Step S108 is performed at the maximum frequency (2.0 GHz in this example), the frequency control signal FCNT supplied to each circuit block 40 is fixed to a high level in correspondence to the maximum frequency.

Next, at Step S106, a layout design of the semiconductor device SEM2 is performed using the logic after the completion of Step S104 (the logic added with the clock gating logic and the logic of the enable signal control circuit FS). In the layout design, a signal line of the frequency control signal FCNT is provisionally connected to a high level signal line such as, for example, a power line in correspondence to the maximum frequency.

Next, at Step S108, the clock CLK is set to the maximum frequency (2.0 GHz in this example), and the static timing verification such as, for example, static timing analysis (STA) is performed. The static timing verification is performed with the clock control signal ENC fixed to a high level and with the clock gating control set to be invalid. Next, when it is determined that the static timing verification passes at Step S110, the process proceeds to Step S112. When it is determined that the static timing verification fails at Step S110, the process returns to Step S100 for logic design.

At Step S112, the static timing verification when the clock gating control is valid is performed for each of six clock frequencies. For example, in the static timing verification when the clock gating control is valid, a relationship between the sum of the delay times DLY1 and DLY2 illustrated in FIG. 6 and the cycle of the clock CLK is verified. That is, a gating-enable frequency of each circuit block 40 is obtained. Next, when it is determined that the static timing verification passes at Step S114, the process is ended. When it is determined that the static timing verification fails at Step S114, the process proceeds to Step S116. In addition, in layout data used for the first static timing verification at Step S112, the signal line of the frequency control signal FCNT is connected to, for example, the power line (high level) in correspondence to the maximum frequency. Therefore, when the first static timing verification passes, it indicates that the gating-enable frequencies of all the circuit blocks 40 are the maximum frequency.

At Step S116, for a circuit block 40 failed in the static timing verification of the clock gating control, the frequency control signal FCNT is changed to the frequency control signal FCNT corresponding to the gating-enable frequency obtained at Step S112. Thereafter, the process proceeds to the layout design of Step S106. That is, a layout connecting a signal line of the changed frequency control signal FCNT to the circuit block 40 is again performed.

As described above, in the embodiment illustrated in FIGS. 2 to 11, as in the embodiment illustrated in FIG. 1, it is also possible to reduce the power consumption of the semiconductor device SEM2 by dynamically switching whether to perform the clock gating control depending on the clock frequency. That is, it is possible to reduce the power consumption of the semiconductor device SEM2 as compared to a case where the clock gating control is evenly set to be invalid in a circuit block 40 whose gating-enable frequency is lower than the highest frequency of the clock CLK.

In addition, in the embodiment illustrated in FIGS. 2 to 11, the enable signal control circuit FS is added to a path transmitting the enable signal EN output from the enable signal generating circuit ENGEN to the clock gating circuit GB. Thus, the semiconductor device SEM2 for implementing the operation illustrated in FIGS. 7 and 8 may be designed by reformation of existing design data. Depending on the electrical characteristics (gating-enable frequency) of the circuit block 40, when the clock frequency making the clock gating control valid or invalid is set for each circuit block 40, it is possible to reduce the power consumption of the semiconductor device SEM2 as compared to that in FIG. 9.

Including the enable signal control circuit FS in the circuit block 40d whose gating-enable frequency is equal to the maximum clock frequency may simplify logic design and timing verification as compared to a case where the enable signal control circuit FS is not included in the circuit block 40d. The enable signal control circuit FS uses the frequency signal FTBL[4:0] output from the frequency setting table 10 to control the generation of the clock control signal ENC. As a result, it is possible to simplify a design of the semiconductor device SEM2 as compared to a case where a new circuit is used to generate a control signal for controlling the generation of the clock control signal ENC.

Figure 12:
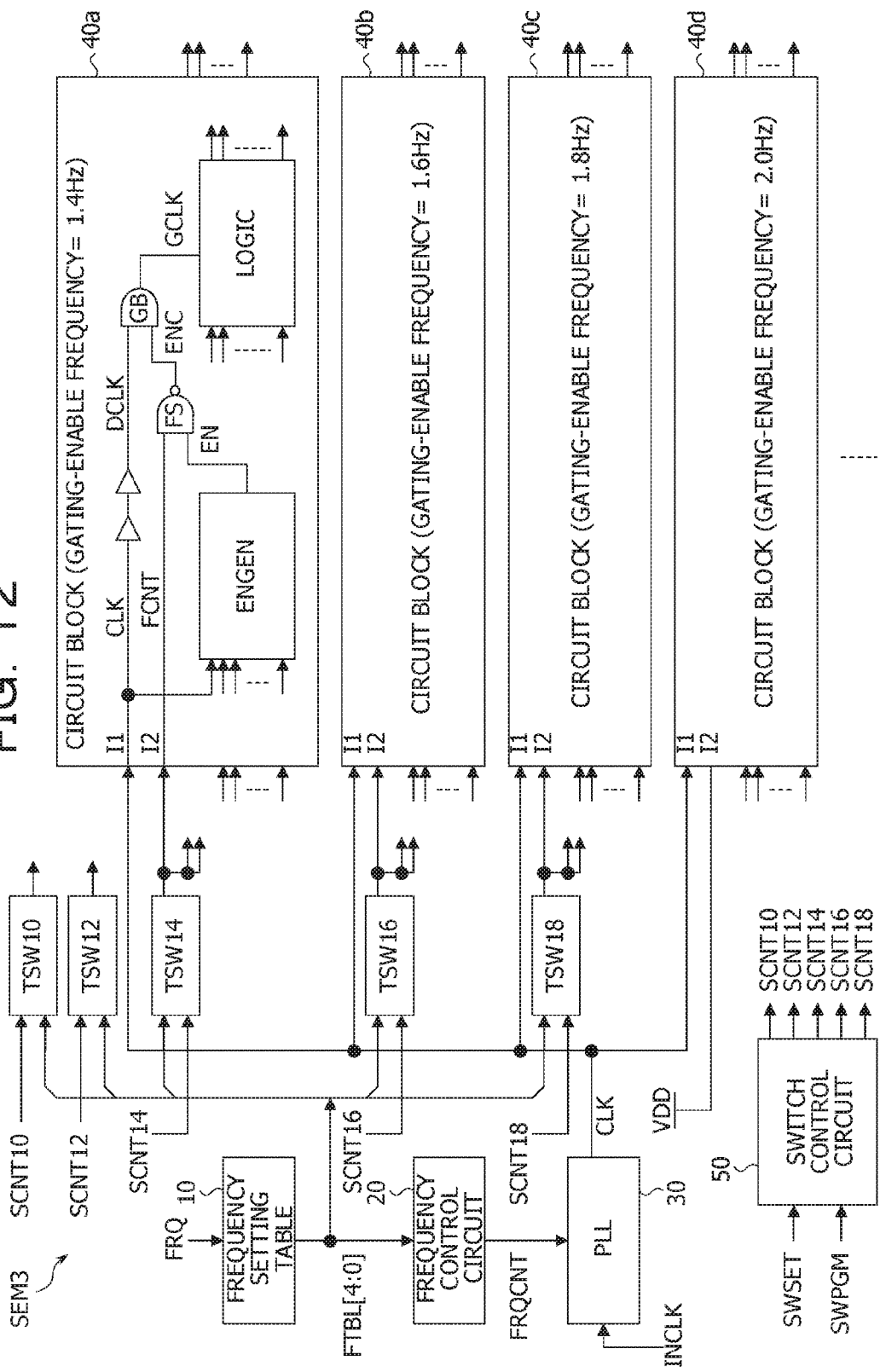
FIG. 12 is a view illustrating a semiconductor device and a method for controlling the semiconductor device according to another embodiment.

FIG. 12 illustrates a semiconductor device and a method for controlling the semiconductor device according to another embodiment. The same elements as those in FIG. 2 are denoted by the same reference numerals as used in FIG. 2, and detailed explanation thereof will be omitted. Referring to FIG. 12, a semiconductor device SEM3 adds test switches TSW1 (TSW10, TSW12, TSW14, TSW16, and TSW18) and a switch control circuit 50 to the semiconductor device SEM2 illustrated in FIG. 2. Other configurations of the semiconductor device SEM3 are the same as the semiconductor device SEM2 illustrated in FIG. 2, except that the frequency signal FTBL[4:0] is supplied to the circuit blocks 40a, 40b, and 40c through the test switch TSW1. The semiconductor device SEM3 employs a DFS method of dynamically changing the frequency of the clock CLK but may employ a DVFS method of dynamically changing the frequency of the clock CLK and a power supply voltage. In addition, a frequency control signal FCNT output from each test switch TSW1 is commonly supplied to the circuit blocks 40 with the same gating-enable frequency.

Each test switch TSW1 selects one of bits of the frequency signal FTBL[4:0] based on a switch control signal SCNT1 (SCNT10, SCNT12, SCNT14, SCNT16, and SCNT18) output from the switch control circuit 50. Then, each test switch TSW1 outputs the selected bit as the frequency control signal FCNT. An example of each test switch TSW1 is illustrated in FIG. 13.

The switch control circuit 50 generates the switch control signal SCNT1 (SCNT10, SCNT12, SCNT14, SCNT16, and SCNT18) based on a set signal SWSET and a program signal SWPGM. The set signal SWSET is supplied to the switch control circuit 50 in order to generate each switch control signal SCNT1 in a test process of the semiconductor device SEM3. After an operation test of the semiconductor device SEM3, the program signal SWPGM is supplied to the switch control circuit 50 in order to set a logic of each switch control signal SCNT1 to a logic determined by the operation test. The set signal SWSET and the program signal SWPGM may be supplied from the outside of the semiconductor device SEM3 or may be generated inside the semiconductor device SEM3.

Figure 13:
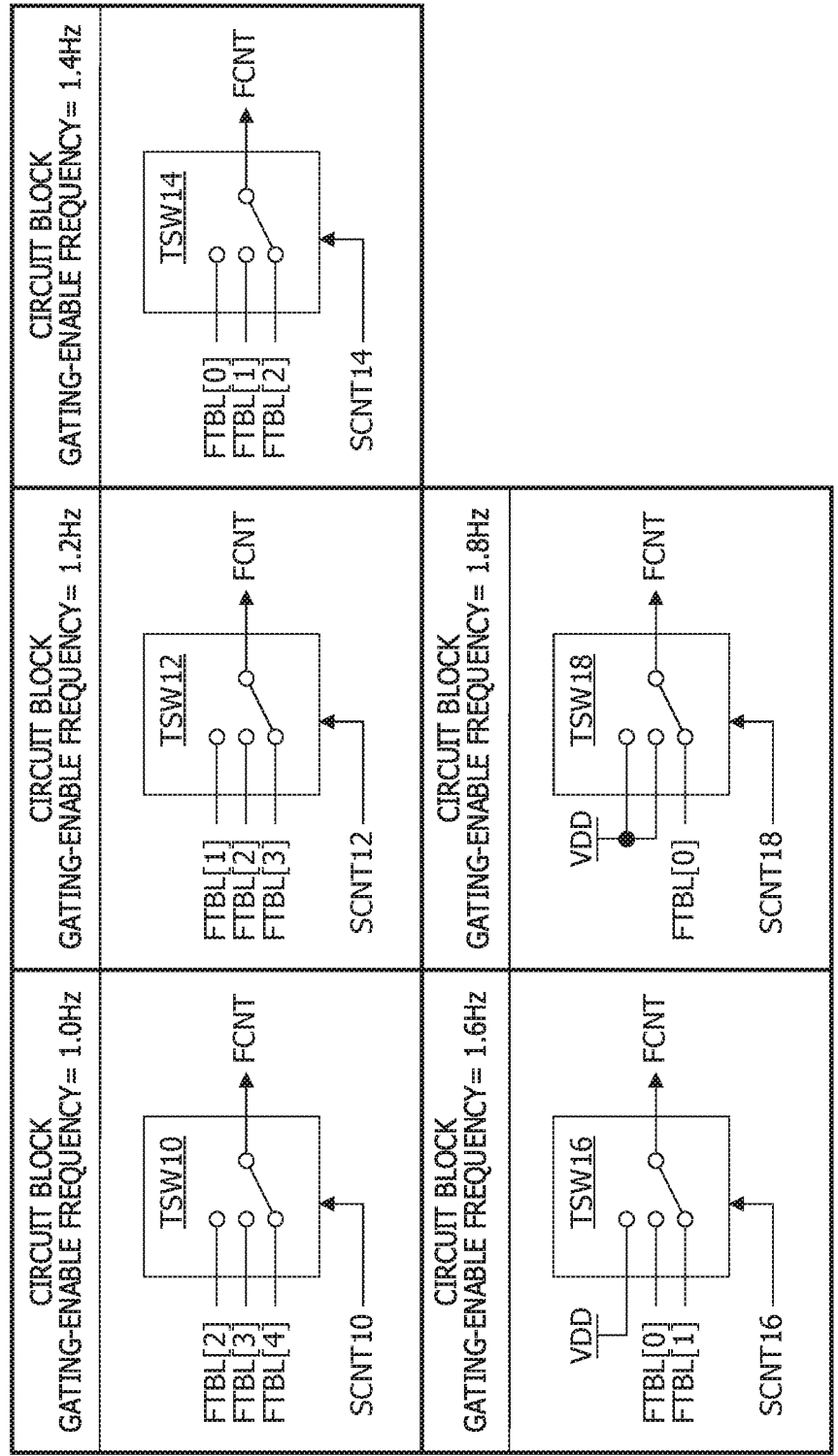
FIG. 13 is a view illustrating one example of a test switch illustrated in FIG. 12.

FIG. 13 illustrates one example of the test switch TSW1 (TSW10 to TSW18) illustrated in FIG. 12. The test switches TSW1 have the same configuration, and each test switch TSW1 selects one of three input terminals according to the logic of the switch control signal SCNT1 (SCNT10 to SCNT18). In each test switch TSW1, a bit value FTBL[i] (i is one of 4, 3, 2, 1, and 0) received in the lowest input terminal indicates a bit value (default value) output as the frequency control signal FCNT at the time of completion of design. A design flow of the semiconductor device SEM3 is the same as FIG. 11.

The test switch TSW10 selects the logic of the frequency control signal FCNT supplied to a circuit block 40 with its gating-enable frequency of 1.0 GHz from one of bits FTBL[4], FTBL[3] and FTBL[2] of the frequency signal FTBL[4:0]. In the test process of the semiconductor device SEM3, when it is determined that all circuit blocks 40 with their gating-enable frequencies of 1.0 GHz may perform the clock gating control at the clock CLK having a frequency of 1.2 GHz, the bit FTBL[3] is selected. In this test process, when it is determined that all circuit blocks 40 with their gating-enable frequencies of 1.0 GHz may perform the clock gating control at the clock CLK having a frequency of 1.4 GHz, the bit FTBL[2] is selected.

The test switch TSW12 selects the logic of the frequency control signal FCNT supplied to a circuit block 40 with its gating-enable frequency of 1.2 GHz from one of bits FTBL[3], FTBL[2], and FTBL[1] of the frequency signal FTBL[4:0]. The test switch TSW14 selects the logic of the frequency control signal FCNT supplied to a circuit block 40a with its gating-enable frequency of 1.4 GHz from one of bits FTBL[2], FTBL[1], and FTBL[0] of the frequency signal FTBL[4:0].

The test switch TSW16 selects the logic of the frequency control signal FCNT supplied to a circuit block 40b with its gating-enable frequency of 1.6 GHz from one of bits FTBL[1] and FTBL[0] of the frequency signal FTBL[4:0] or one of high level signal lines. The high level signal lines are, for example, power lines VDD. The test switch TSW18 selects the logic of the frequency control signal FCNT supplied to a circuit block 40c with its gating-enable frequency of 1.8 GHz from the bit FTBL[0] of the frequency signal FTBL[4:0] or one of high level power lines VDD.

When it is determined that the gating-enable frequency is higher than a designed value in the test process, the test switches TSW12 to TSW18 select a bit FTBL[i] corresponding to the determined gating-enable frequency, as in the test switch TSW10. In the semiconductor device SEM3 (semiconductor chip), electrical characteristics of elements such as, for example, the transistors are changed depending on variation of manufacture conditions. For example, since the threshold voltages of the transistors within the semiconductor device SEM3 are changed in the same direction depending on the variation of manufacture conditions, the gating-enable frequencies of the plurality of circuit blocks 40 are changed in the same direction. Accordingly, the frequency control signal FCNT supplied to the plurality of circuit blocks 40 with the common designed value of the gating-enable frequency may be changed by the common test switch TSW1.

Figure 14:
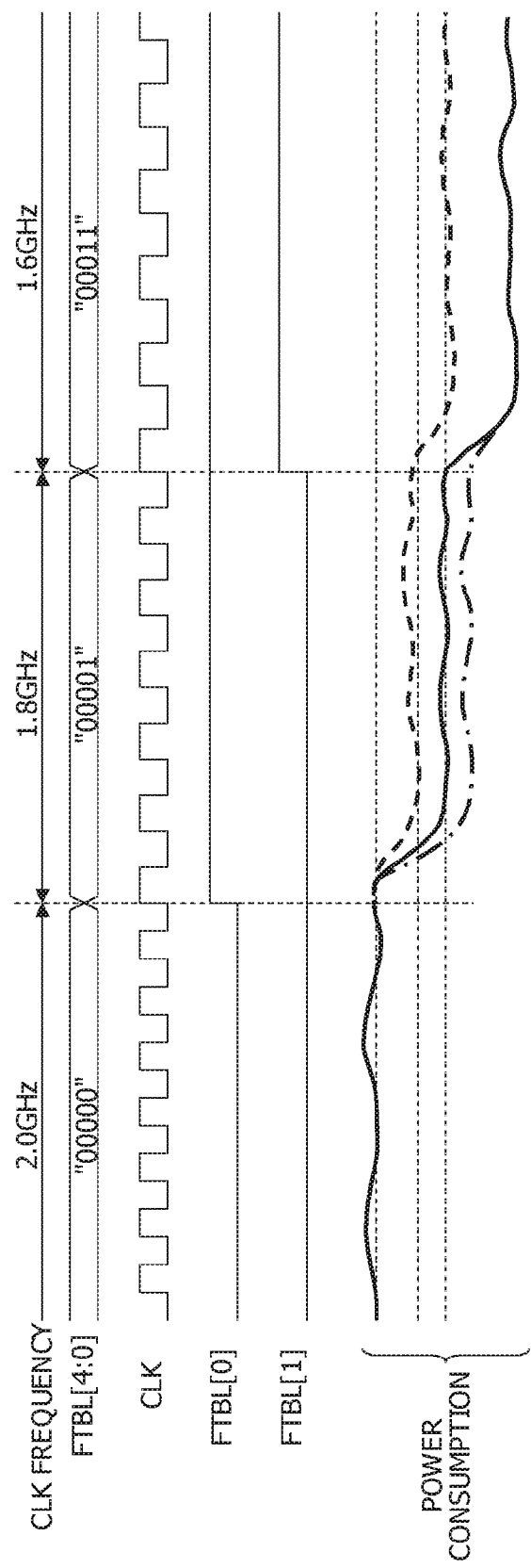
FIG. 14 is a view illustrating one example of a change in power consumption by a clock frequency of the semiconductor device illustrated in FIG. 12.

FIG. 14 illustrates one example of a change in power consumption by the clock frequency of the semiconductor device SEM3 illustrated in FIG. 12. Detailed explanation about the same operation as that in FIG. 10 will be omitted. As in FIG. 10, a thick solid line indicates a change in power consumption of the semiconductor device SEM3, and a thick broken line indicates a change in power consumption of a semiconductor device which does not include the enable signal control circuit FS.

FIG. 14 illustrates an example in which it is determined by the test process of the semiconductor device SEM3 that the circuit block 40 with its gating-enable frequency of 1.6 GHz may perform the clock gating control at the clock CLK having a frequency of 1.8 GHz. In this case, the switch control circuit 50 illustrated in FIG. 12 changes the logic of the switch control signal SCNT16 from a default value determined by design, according to the program signal SWPGM.

The test switch TSW16 illustrated in FIG. 13 selects the bit FTBL[0] by the switch control signal SCNT16 and outputs it as the frequency control signal FCNT. Accordingly, the circuit block 40b with its gating-enable frequency determined to be 1.6 GHz in design operates as the circuit block 40b with its gating-enable frequency of 1.8 GHz. As a result, as indicated by a thick dashed line in FIG. 14, power consumption of the semiconductor device SEM3 in a period during which the frequency of the clock CLK is 1.8 GHz may be further reduced as compared to power consumption indicated by a thick solid line.

Figure 15:
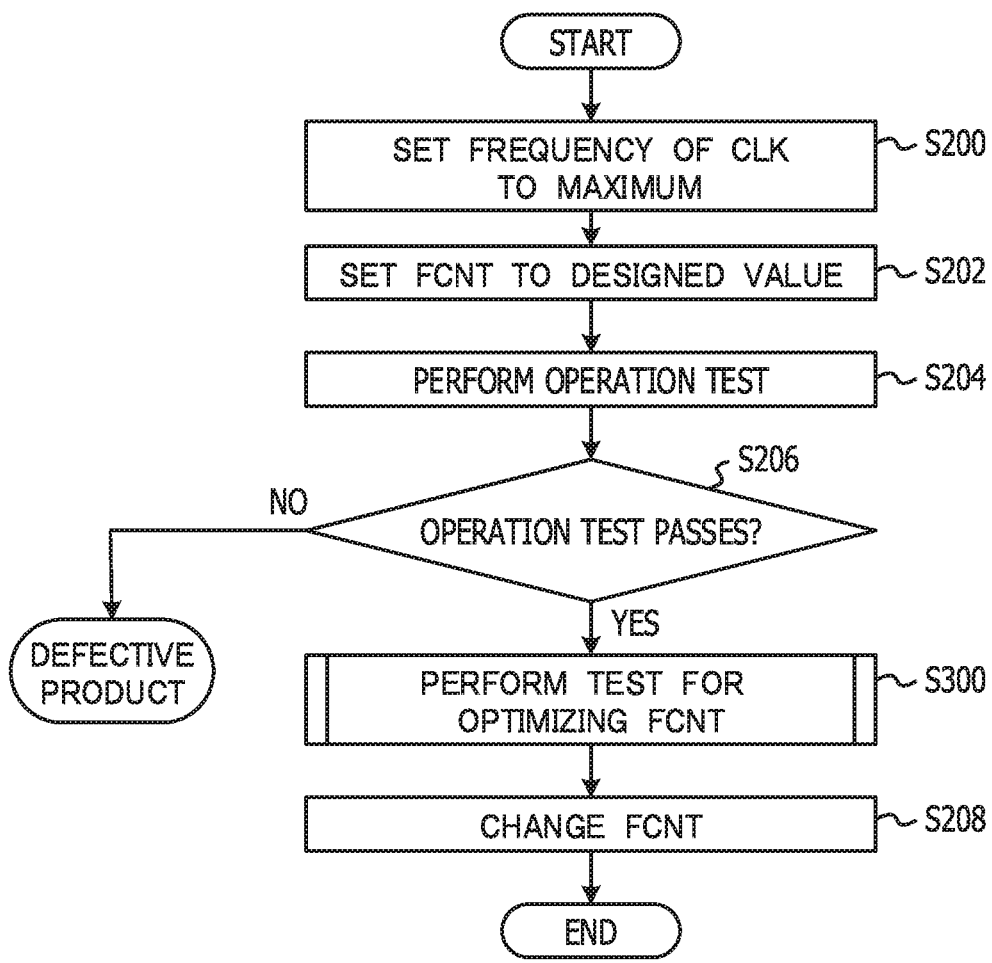
FIG. 15 is a view illustrating one example of a test flow of the semiconductor device illustrated in FIG. 12.

FIG. 15 illustrates one example of a test flow of the semiconductor device SEM3 illustrated in FIG. 12. The flow illustrated in FIG. 15 is performed using a tester such as, for example, a large scale integration (LSI) tester.

First, at Step S200, the tester sets the frequency of the clock CLK to a maximum (e.g., 2.0 GHz). Next, at Step S202, the tester outputs the set signal SWSET to the switch control circuit 50 and sets the frequency control signal FCNT to a designed value (default value). Next, at Step S204, the tester performs an operation test of the semiconductor device SEM3.

Next, at Step S206, when it is determined that the operation test passes, the process of the tester proceeds to Step S300. When it is determined that the operation test fails, the semiconductor device SEM3 is handled as a defective product.

Figure 16:
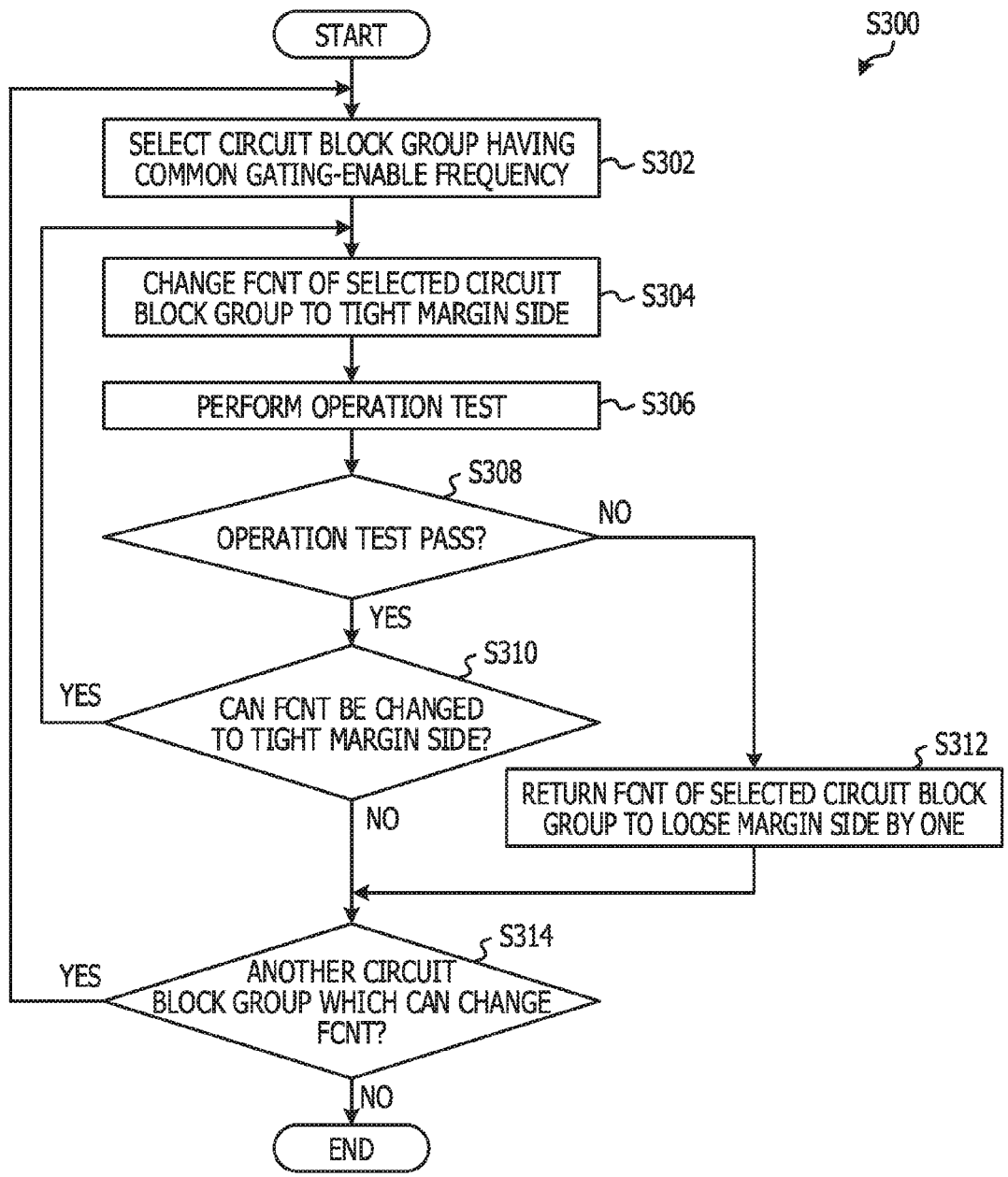
FIG. 16 is a view illustrating one example of a process of Step S300 illustrated in FIG. 15.

At Step S300, the tester performs a test for optimizing the frequency control signal FCNT according to the capability of the gating-enable frequency. An example of the process of Step S300 is illustrated in FIG. 16. After performing the test for optimizing the frequency control signal FCNT, at Step S208, the tester outputs the program signal SWPGM to the switch control circuit 50 based on the specification of the frequency control signal FCNT determined in the optimization test of Step S300. Then, the switch control signal SCNT1 corresponding to an actual value of the gating-enable frequency determined in the optimization test of Step S300 is output to the switch control circuit 50. The logic of the switch control signal SCNT1 output to the switch control circuit 50 based on the program signal SWPGM is stored even when the semiconductor device SEM3 is powered off.

Thereafter, each test switch TSW1 of the semiconductor device SEM3 mounted and operating on a system selects a bit FTBL[i] output as the frequency control signal FCNT, based on the switch control signal SCNT1. That is, even when the electrical characteristics of the semiconductor device SEM3 are changed to a side of a good characteristic with respect to the standard value due to the variation of manufacture conditions, it is possible to optimize the frequency control signal FCNT according to the capability of the gating-enable frequency.

FIG. 16 illustrates one example of the process of Step S300 illustrated in FIG. 15. First, at Step S302, the tester selects a circuit block group 40 with the common gating-enable frequency. Next, at Step S304, the tester changes the frequency control signal FCNT of the selected circuit block group 40 to a tight margin side (a side where a bit FTBL[i] number is decremented) by one. For example, the frequency control signal FCNT supplied to the circuit block group 40b with its gating-enable frequency of 1.6 GHz is changed from the bit FTBL[1] to the bit FTBL[0].

Next, at Step S306, the tester performs the operation test of the semiconductor device SEM3. Next, at Step S308, when it is determined that the operation test passes, the process of the tester proceeds to Step S310. When it is determined that the operation test fails, the process of the tester proceeds to Step S312.

When it is determined at Step S310 that the frequency control signal FCNT may be changed to the tight margin side, the process of the tester proceeds to Step S304. At Step S304, the frequency control signal FCNT is changed to a tighter margin side. When the frequency control signal FCNT is set to a tight margin upper limit, the process of the tester proceeds to Step S314.

At Step S312, the tester returns the frequency control signal FCNT of the selected circuit block group 40 to a loose margin side (a side where a bit FTBL[i] number is incremented) by one, and then, the process proceeds to Step S314. When it is determined at Step S314 that there is another circuit block group 40 which may change the frequency control signal FCNT, the process of the tester returns to Step S302. When it is determined that there is no other circuit block group 40 which may change the frequency control signal FCNT, the process is ended. With the above-described process, the frequency control signal FCNT may be optimized according to the ability of the gating-enable frequency, thereby contributing to the reduction of the power consumption of the semiconductor device SEM3. In addition, as the semiconductor device SEM3 operates in the same way as that in FIGS. 7 and 8, the power consumption of the semiconductor device SEM3 may be reduced as compared to that in FIG. 9.

As described above, in the embodiment illustrated in FIGS. 12 to 16, as in the embodiment illustrated in FIG. 1, it is also possible to reduce the power consumption of the semiconductor device SEM3 by dynamically switching whether to perform the clock gating control depending on the clock frequency. In addition, as in the embodiment illustrated in FIGS. 2 to 11, the semiconductor device SEM3 for implementing the operation illustrated in FIGS. 7 and 8 may be designed by reformation of existing design data and insertion of the enable signal control circuit FS. By including the enable signal control circuit FS in the circuit block 40d whose gating-enable frequency is equal to the maximum clock frequency, the logic design and timing verification may be simplified as compared to a case where the enable signal control circuit FS is not included in the circuit block 40d. By using the frequency signal FTBL[4:0] output from the frequency setting table 10, it is possible to simplify a design of the semiconductor device SEM3 as compared to a case of designing a new circuit to control generation of the clock control signal ENC.

In addition, in the embodiment illustrated in FIGS. 12 to 16, even when the electrical characteristics of the semiconductor device SEM3 are changed to a side of a good characteristic with respect to the standard value due to variation of manufacture conditions, it is possible to optimize the frequency control signal FCNT according to the ability of the gating-enable frequency.

Figure 17:
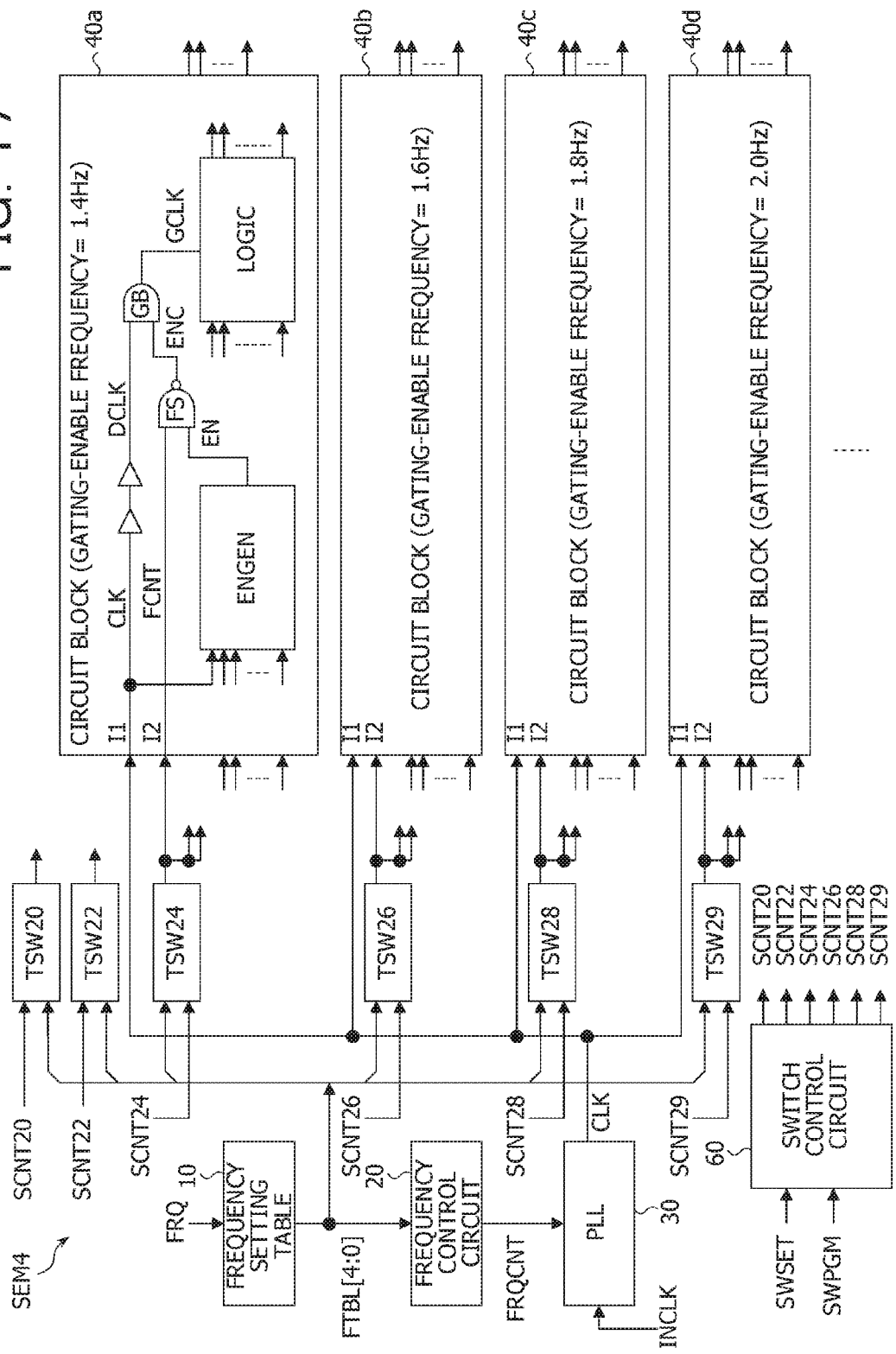
FIG. 17 is a view illustrating a semiconductor device and a method for controlling the semiconductor device according to another embodiment.

FIG. 17 illustrates a semiconductor device and a method for controlling the semiconductor device according to another embodiment. The same elements as those in the embodiments illustrated in FIGS. 2 and 12 are denoted by the same reference numerals as used in FIGS. 2 and 12, and detailed explanation thereof will be omitted. Referring to FIG. 17, a semiconductor device SEM4 includes test switches TSW2 (TSW20, TSW22, TSW24, TSW26, TSW28, and TSW29), instead of the test switches TSW10 to TSW18 illustrated in FIG. 12. In addition, the semiconductor device SEM4 includes a switch control circuit 60, instead of the switch control circuit 50 illustrated in FIG. 12. Other configurations of the semiconductor device SEM4 are the same as those of the semiconductor device SEM3 illustrated in FIG. 12. The semiconductor device SEM4 employs a DFS method of dynamically changing the frequency of the clock CLK but may employ a DVFS method of dynamically changing the frequency of the clock CLK and a power supply voltage. In addition, a frequency control signal FCNT output from each test switch TSW2 is commonly supplied to the circuit blocks 40 with the same gating-enable frequency.

Each test switch TSW2 selects one of bits of the frequency signal FTBL[4:0] based on a switch control signal SCNT2 (SCNT20, SCNT22, SCNT24, SCNT26, SCNT28, and SCNT29) output from the switch control circuit 60. Then, each test switch TSW2 outputs the selected bit as the frequency control signal FCNT. An example of each test switch TSW2 is illustrated in FIG. 18.

The switch control circuit 60 generates the switch control signals SCNT20, SCNT22, SCNT24, SCNT26, SCNT28, and SCNT29 based on a set signal SWSET and a program signal SWPGM. The switch control circuit 60 operates in the same way as the switch control circuit 50 illustrated in FIG. 12, except for the switch control signals SCNT20, SCNT22, SCNT24, SCNT26, SCNT28, and SCNT29 to be output.

Figure 18:
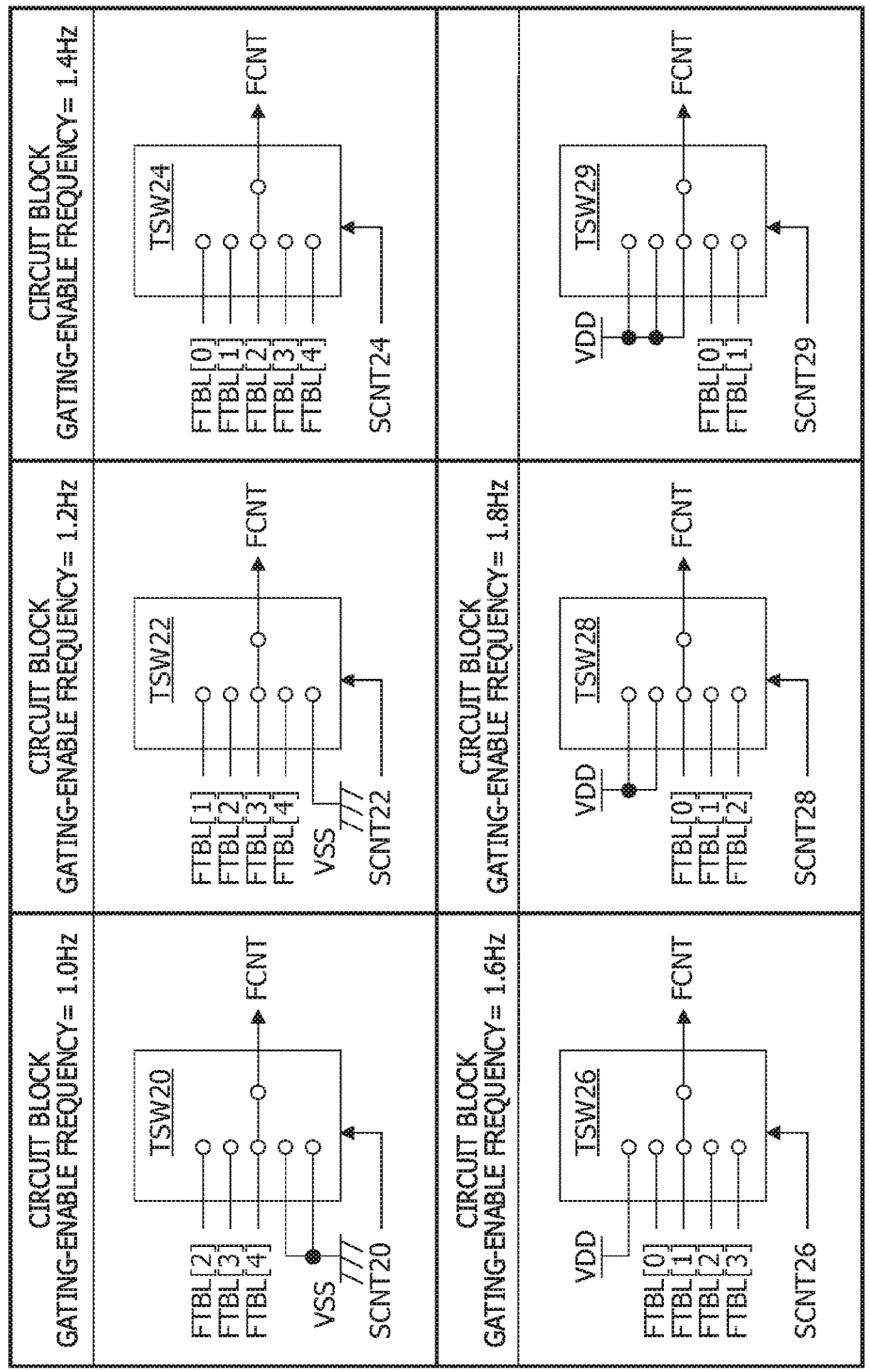
FIG. 18 is a view illustrating one example of a test switch illustrated in FIG. 17.

FIG. 18 illustrates one example of the test switch TSW2 (TSW20 to TSW29) illustrated in FIG. 17. Detailed explanation about the same elements as the test switches TSW10 to TSW18 illustrated in FIG. 13 will be omitted. The test switches TSW2 have the same configuration, and each test switch TSW1 selects one of five input terminals depending on the logic of the switch control signal SCNT2. In each test switch TSW2, a bit value FTBL[i] (i is one of 4, 3, 2, 1, and 0) or a high level VDD received in the central input terminal indicates a bit value (default value) output as the frequency control signal FCNT at the time of completion of design. A design flow of the semiconductor device SEM4 is the same as FIG. 11.

The test switch TSW20 selects the logic of the frequency control signal FCNT supplied to a circuit block 40 with its gating-enable frequency of 1.0 GHz from one of bits FTBL[4], FTBL[3], and FTBL[2] of the frequency signal FTBL[4:0]. The test switch TSW22 selects the logic of the frequency control signal FCNT supplied to a circuit block 40 with its gating-enable frequency of 1.2 GHz from one of bits FTBL[4], FTBL[3], FTBL[2], and FTBL[1]. The test switch TSW24 selects the logic of the frequency control signal FCNT supplied to a circuit block 40a with its gating-enable frequency of 1.4 GHz from one of bits FTBL[4], FTBL[3], FTBL[2], FTBL[1], and FTBL[0].

The test switch TSW26 selects the logic of the frequency control signal FCNT supplied to a circuit block 40b with its gating-enable frequency of 1.6 GHz from one of bits FTBL[3] to FTBL[0] or a high level VDD. The test switch TSW28 selects the logic of the frequency control signal FCNT supplied to a circuit block 40c with its gating-enable frequency of 1.8 GHz from one of bits FTBL[2], FTBL[1], and FTBL[0] or a high level VDD. The test switch TSW29 selects the logic of the frequency control signal FCNT supplied to a circuit block 40d with its gating-enable frequency of 2.0 GHz from one of bits FTBL[1] and FTBL[0] or a high level VDD.

In this embodiment, the frequency control signal FCNT may be set to a loose timing margin side as well as a tight timing margin side by the test switch TSW2. Thus, even when the gating-enable frequency of the circuit blocks 40 is transitioned to a lower side depending on variation of manufacture conditions in a process of manufacturing the semiconductor device SEM4 (semiconductor chip), it is possible to rescue the semiconductor device SEM4 without being disposed of as a defective product.

Figure 19:
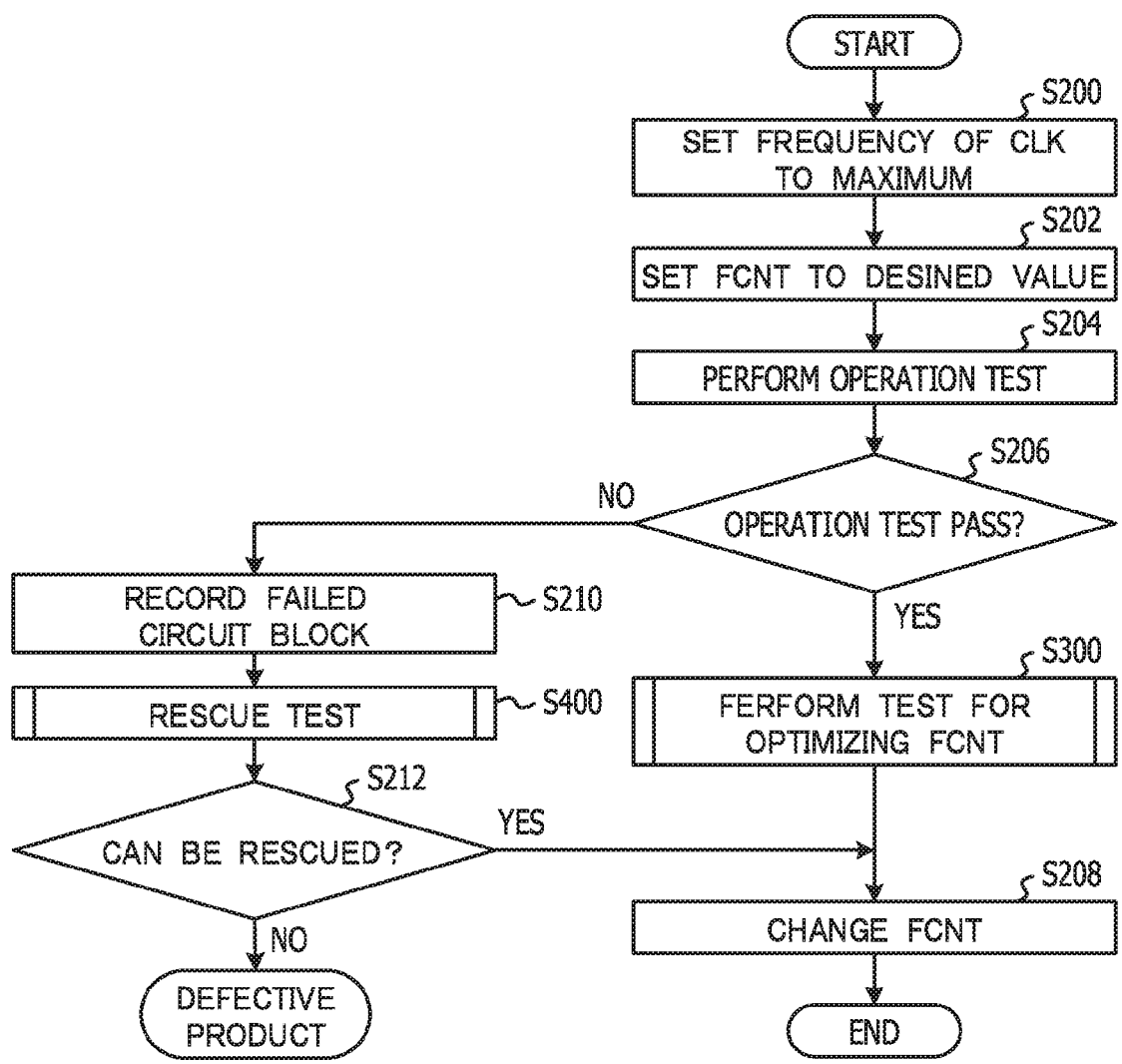
FIG. 19 is a view illustrating one example of a test flow of the semiconductor device illustrated in FIG. 17.

FIG. 19 illustrates one example of a test flow of the semiconductor device SEM4 illustrated in FIG. 17. Detailed explanation about the same process as FIG. 15 will be omitted. In this embodiment, Steps S210, S400, and S212 are added to the process illustrated in FIG. 15. That is, when it is determined at Step S206 that the operation test fails, the tester performs the process of Step S210.

Figure 20:
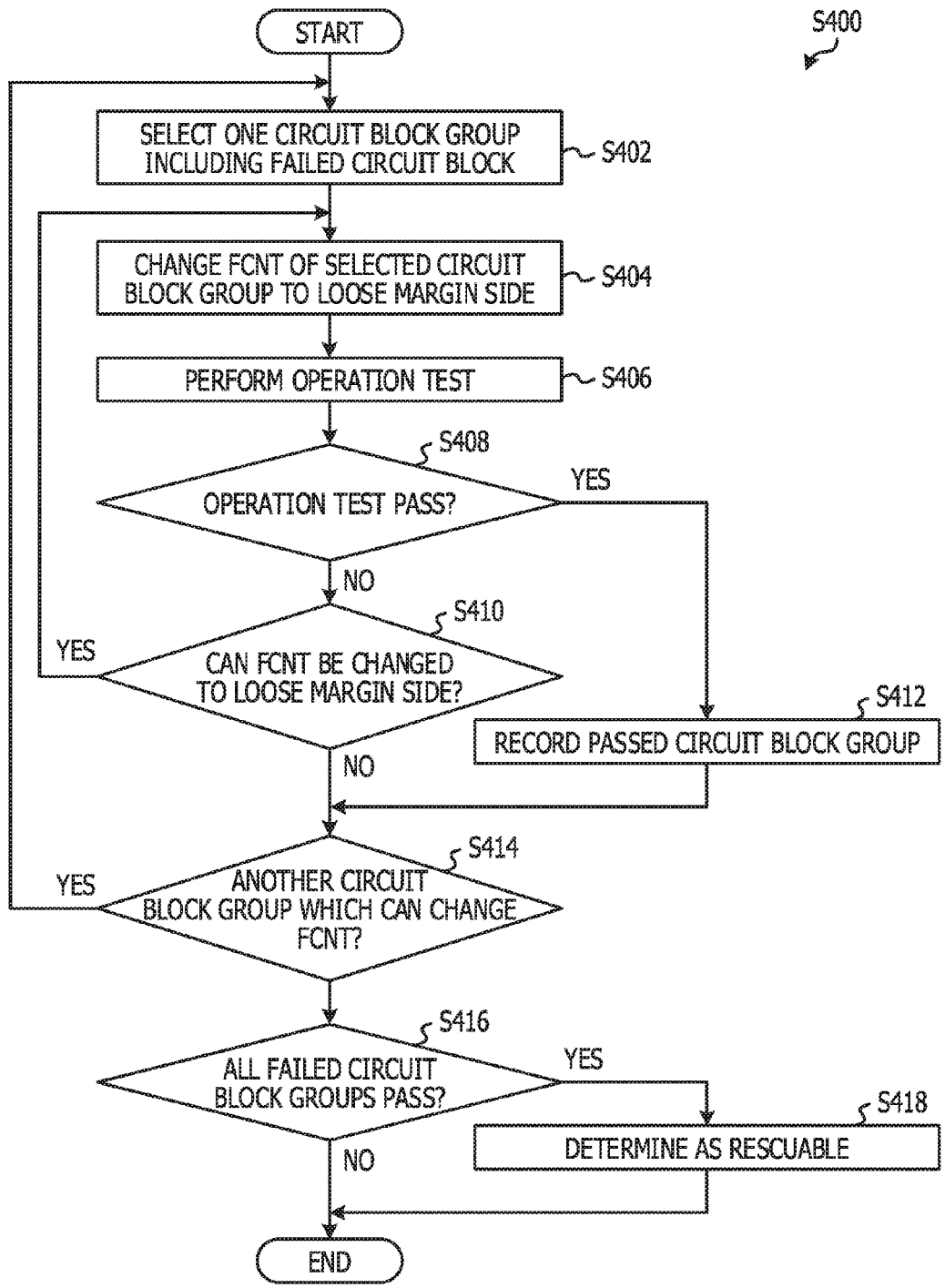
FIG. 20 is a view illustrating one example of a process of Step S400 illustrated in FIG. 19.

At Step S210, the tester records information identifying the circuit block 40 failed in the operation test. Next, at Step S400, the tester performs a rescue test for rescuing the semiconductor device SEM4 by optimizing the frequency control signal FCNT according to the ability of the gating-enable frequency. An example of Step S400 is illustrated in FIG. 20. After the rescue test, when it is determined at Step S212 that the semiconductor device SEM4 may be rescued by changing the frequency control signal FCNT to a loose margin side, the process of the tester proceeds to Step S208. When it is determined that the semiconductor device SEM4 is hard to be rescued even by changing the frequency control signal FCNT to the loose margin side, the process is ended.

FIG. 20 illustrates one example of the process of Step S400 illustrated in FIG. 19. At Step S402, the tester selects one circuit block group 40 including the failed circuit block 40 recorded at Step S210 illustrated in FIG. 19. Next, at Step S404, the tester changes the frequency control signal FCNT of the selected circuit block group 40 to a loose margin side (a side where a bit FTBL[i] number is incremented) by one. For example, the frequency control signal FCNT supplied to the circuit block group 40b with its gating-enable frequency of 1.6 GHz is changed from the bit FTBL[1] to the bit FTBL[2].

Next, at Step S406, the tester performs the operation test of the semiconductor device SEM4. Next, at Step S408, when it is determined that the operation test passes, the process of the tester proceeds to Step S412. When it is determined that the operation test fails, the process of the tester proceeds to Step S410.

When it is determined at Step S410 that the frequency control signal FCNT may be changed to the loose margin side, the process of the tester proceeds to Step S404. At Step S404, the frequency control signal FCNT is changed to a looser margin side. When it is determined that the frequency control signal FCNT is set to a loose margin lower limit, the process of the tester proceeds to Step S414. At Step S412, the tester records information identifying the circuit block group 40 determined to be passed at Step S408, and the process proceeds to Step S414.

When it is determined at Step S414 that there is another circuit block group 40 which may change the frequency control signal FCNT, the process of the tester returns to Step S402. When it is determined that there is no other circuit block group 40 which may change the frequency control signal FCNT, the process proceeds to Step S416. At Step S416, when it is determined that all of circuit block groups 40 including the failed circuit block recorded at Step S210 illustrated in FIG. 19 pass according to the determination at Step S408, the process of the tester proceeds to Step S418. Here, the circuit block groups 40 passed according to the determination at Step S408 are identified based on the information recorded at Step S412. When it is determined that one of the failed circuit blocks 40 recorded at Step S210 illustrated in FIG. 19 fails according to the determination at Step S408, the tester determines that the semiconductor device SEM4 is hard to be rescued, and ends the process. At Step S418, the tester determines that the semiconductor device SEM4 may be rescued, and ends the process.

At Step S208 illustrated in FIG. 19, based on the specification of the frequency control signal FCNT determined in the optimization test at Step S300 and the rescue test at Step S400, the tester outputs the program signal SWPGM to the switch control circuit 50. That is, the specification of the bit FTBL[i] of the frequency signal FTBL[4:0] selected as the frequency control signal FCNT is changed. With the above-described process, the frequency control signal FCNT may be optimized according to the ability of the gating-enable frequency, thereby contributing to the reduction of the power consumption of the semiconductor device SEM4 and improving a yield which is a non-defective rate of the semiconductor device SEM4. The semiconductor device SEM4 operates in the same way as that in FIGS. 7 and 8.

As described above, the embodiment illustrated in FIGS. 17 to 20 may also achieve the same effects as those in the embodiment illustrated in FIGS. 1 to 16. In addition, in the embodiment illustrated in FIGS. 17 to 20, even when the electrical characteristics of the semiconductor device SEM4 are changed to a side of a bad characteristic with respect to the standard value due to the variation of manufacture conditions, it is possible to optimize the frequency control signal FCNT according to the ability of the gating-enable frequency.

Figure 21:
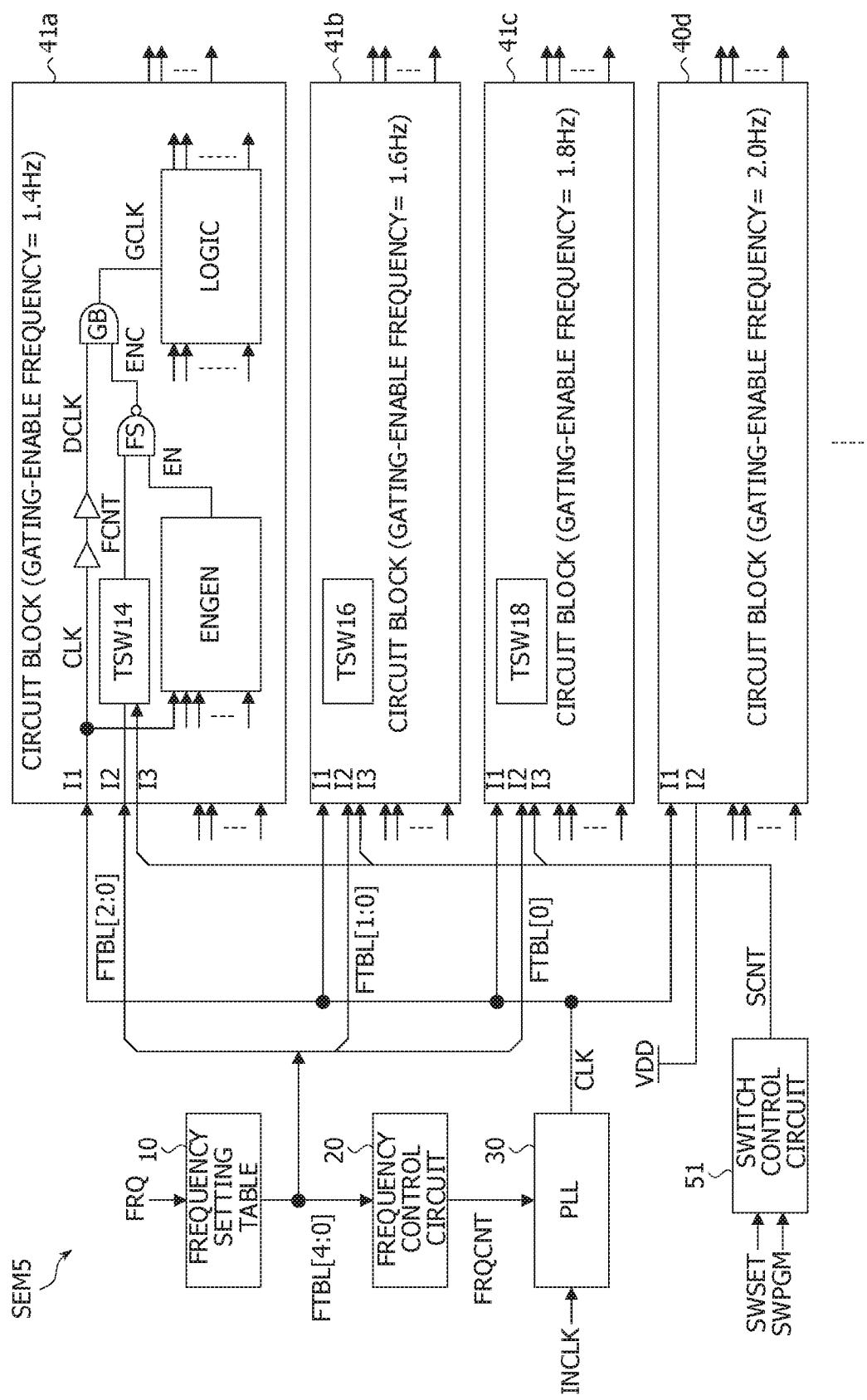
FIG. 21 is a view illustrating a semiconductor device and a method for controlling the semiconductor device according to another embodiment.

FIG. 21 illustrates a semiconductor device and a method for controlling the semiconductor device according to another embodiment. The same elements as those in the embodiments illustrated in FIGS. 2 and 12 are denoted by the same reference numerals as used in FIGS. 2 and 12, and detailed explanation thereof will be omitted. Referring to FIG. 21, a semiconductor device SEM5 includes circuit blocks 41 (41a, 41b, and 41c) including each of the test switches TSW1 (TSW10, TSW12, TSW14, TSW16, and TSW18) illustrated in FIG. 12 and the same circuit block 40d as that in FIG. 2. The semiconductor device SEM5 employs a DFS method of dynamically changing the frequency of the clock CLK but may employ a DVFS method of dynamically changing the frequency of the clock CLK and a power supply voltage.

Circuit blocks 41 with their respective gating-enable frequencies of 1.0 GHz and 1.2 GHz are omitted in FIG. 21. As illustrated in FIG. 21, the test switches TSW1 are provided for respective circuit blocks 41 rather than respective circuit block groups 41 with the common gating-enable frequency. In addition, the semiconductor device SEM5 includes a switch control circuit 51, instead of the switch control circuit 50 illustrated in FIG. 12. The switch control circuit 51 generates a switch control signal SCNT for each of the test switches TSW1 respectively included in the circuit blocks 41a, 41b, and 41c. Other configurations of the semiconductor device SEM5 are the same as those of the semiconductor device SEM2 illustrated in FIG. 2. In addition, the semiconductor device SEM5 has the same design flow as that in FIG. 11. The semiconductor device SEM5 operates in the same way as that in FIGS. 7 and 8.

Figure 22:
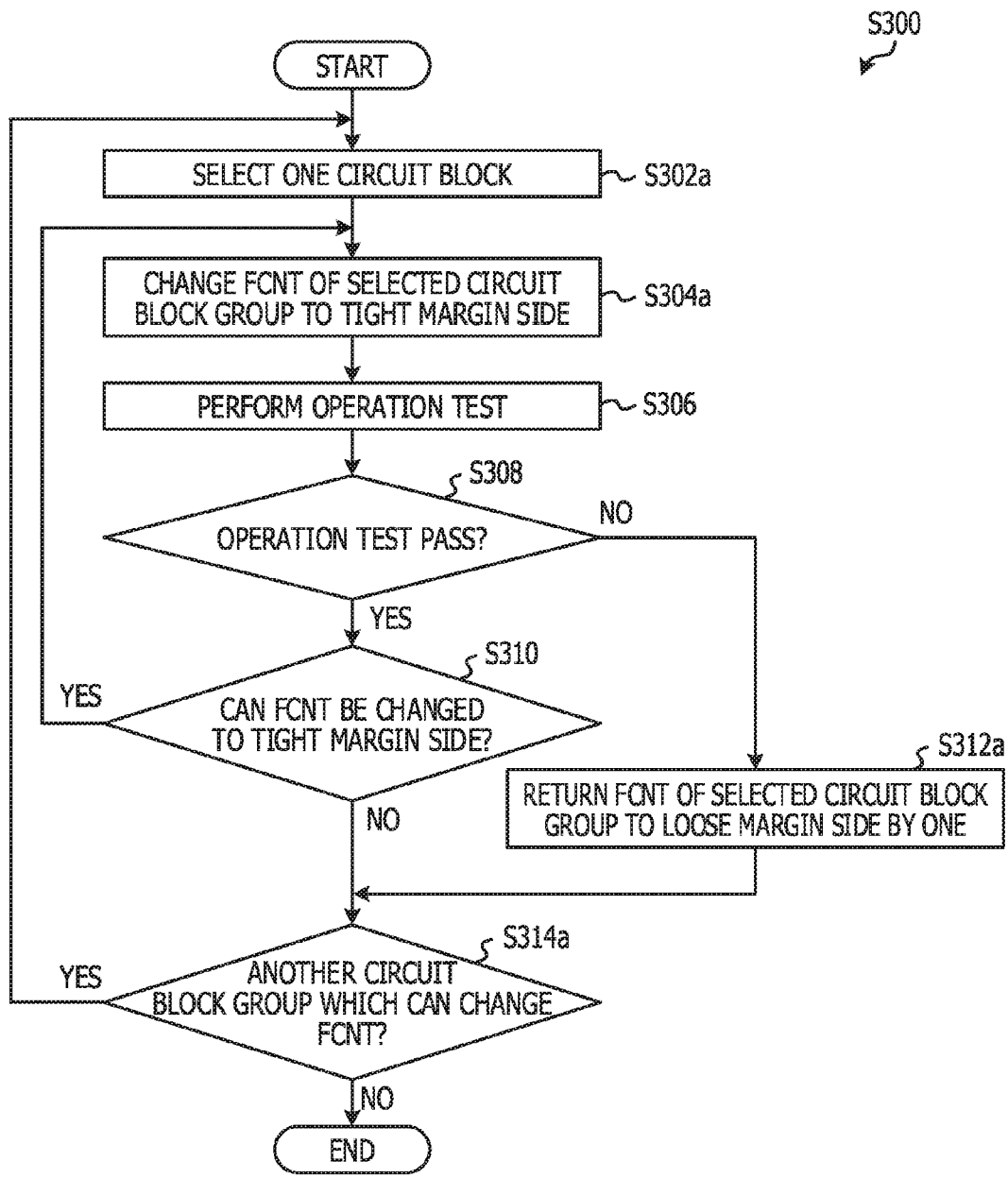
FIG. 22 is a view illustrating one example of a process of Step S300 in a test flow of the semiconductor device illustrated in FIG. 21.

FIG. 22 illustrates one example of a process of Step S300 in a test flow of the semiconductor device SEM5 illustrated in FIG. 21. Detailed explanation about the same process as that in FIG. 16 will be omitted. In addition, the entire test flow is the same as that in FIG. 15. In FIG. 22, Steps S302a, S304a, S312a, and S314a are performed, instead of Steps S302, S304, S312, and S314 illustrated in FIG. 16. The processes of Steps S302a, S304a, S312a, and S314a are the same as those in Steps S302, S304, S312, and S314 illustrated in FIG. 16, except that the processes are performed for each circuit block 41 rather than each circuit block group 41. That is, in this embodiment, a process of setting a margin of the frequency control signal FCNT to be tight is performed for each circuit block 41. This makes it possible to optimize the frequency control signal FCNT according to the electrical characteristics of each of the circuit blocks 41. In contrast, in the embodiment illustrated in FIGS. 12 to 16, the common frequency control signal FCNT is supplied to all circuit blocks 40 of the circuit block groups with the common gating-enable frequency. Therefore, when each circuit block group 40 includes even one circuit block 40 whose ability of the gating-enable frequency is not higher than a designed value, a process of setting the frequency control signal FCNT to a tight margin side is not performed.

As described above, the embodiment illustrated in FIGS. 21 and 22 may achieve the same effects as those in the embodiment illustrated in FIGS. 1 to 16. In addition, in the embodiment illustrated in FIGS. 21 and 22, it is possible to optimize the frequency control signal FCNT according to the electrical characteristics of each of the circuit blocks 41.

Figure 23:
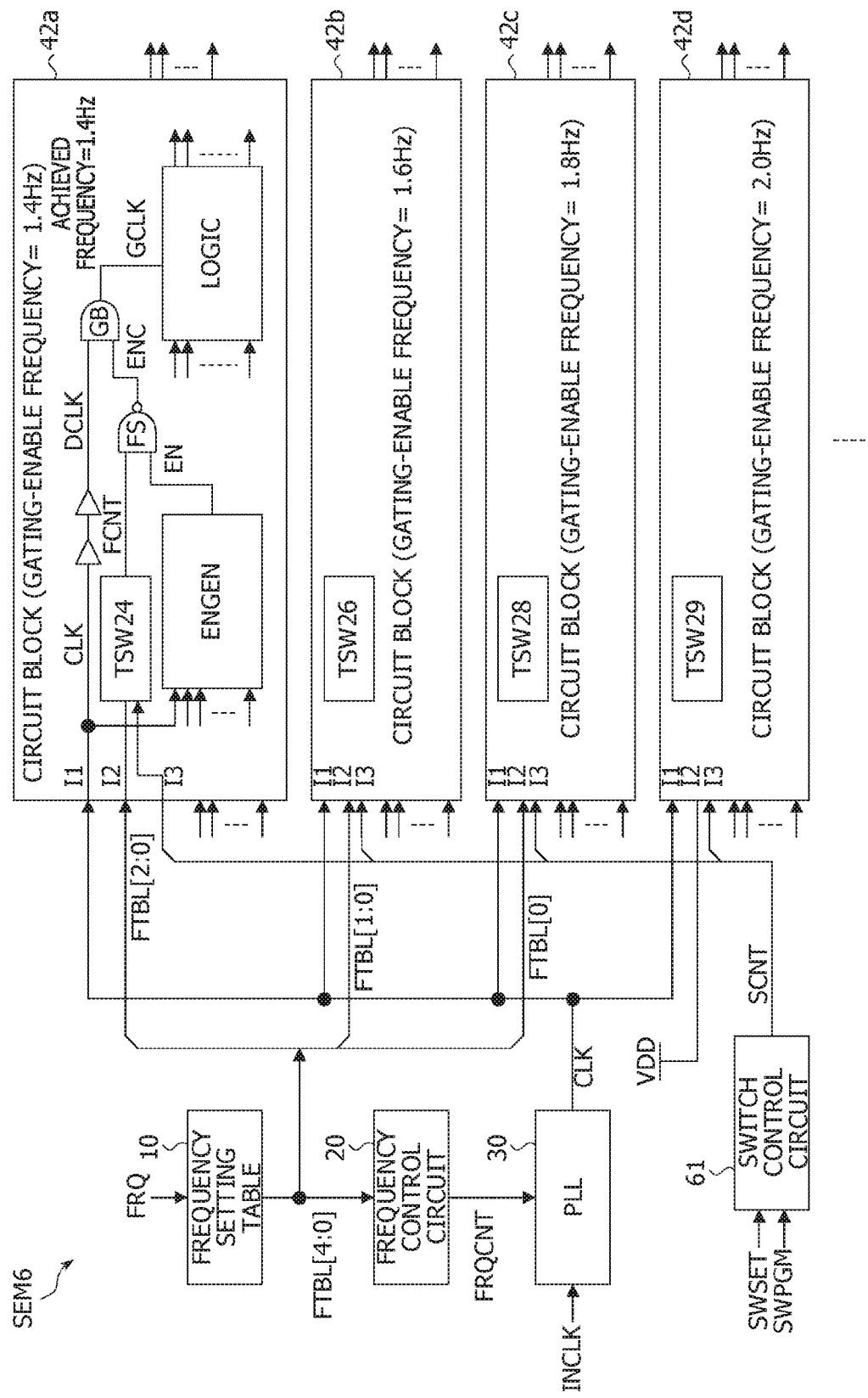
FIG. 23 is a view illustrating a semiconductor device and a method for controlling the semiconductor device according to another embodiment.

FIG. 23 illustrates a semiconductor device and a method for controlling the semiconductor device according to another embodiment. The same elements as those in the embodiments illustrated in FIGS. 2 and 17 are denoted by the same reference numerals as used in FIGS. 2 and 17, and detailed explanation thereof will be omitted. Referring to FIG. 23, a semiconductor device SEM6 includes circuit blocks 42 (42a, 42b, 42c, and 42d) including each of the test switches TSW2 (TSW20, TSW22, TSW24, TSW26, TSW28, and TSW29) illustrated in FIG. 17. The semiconductor device SEM6 employs a DFS method of dynamically changing the frequency of the clock CLK but may employ a DVFS method of dynamically changing the frequency of the clock CLK and a power supply voltage.

Circuit blocks 42 with their respective gating-enable frequencies of 1.0 GHz and 1.2 GHz are omitted in FIG. 23. As illustrated in FIG. 23, the test switches TSW2 are provided for respective circuit blocks 42 rather than respective circuit block groups 40 with the common gating-enable frequency. In addition, the semiconductor device SEM6 includes a switch control circuit 61, instead of the switch control circuit 60 illustrated in FIG. 17. The switch control circuit 61 generates a switch control signal SCNT for each of the test switches TSW2 respectively included in the circuit blocks 42a, 44b, 42c, and 42d. Other configurations of the semiconductor device SEM6 are the same as those of the semiconductor device SEM2 illustrated in FIG. 2. In addition, the semiconductor device SEM6 has the same design flow as that in FIG. 11. The semiconductor device SEM6 operates in the same way as that in FIGS. 7 and 8.

Figure 24:
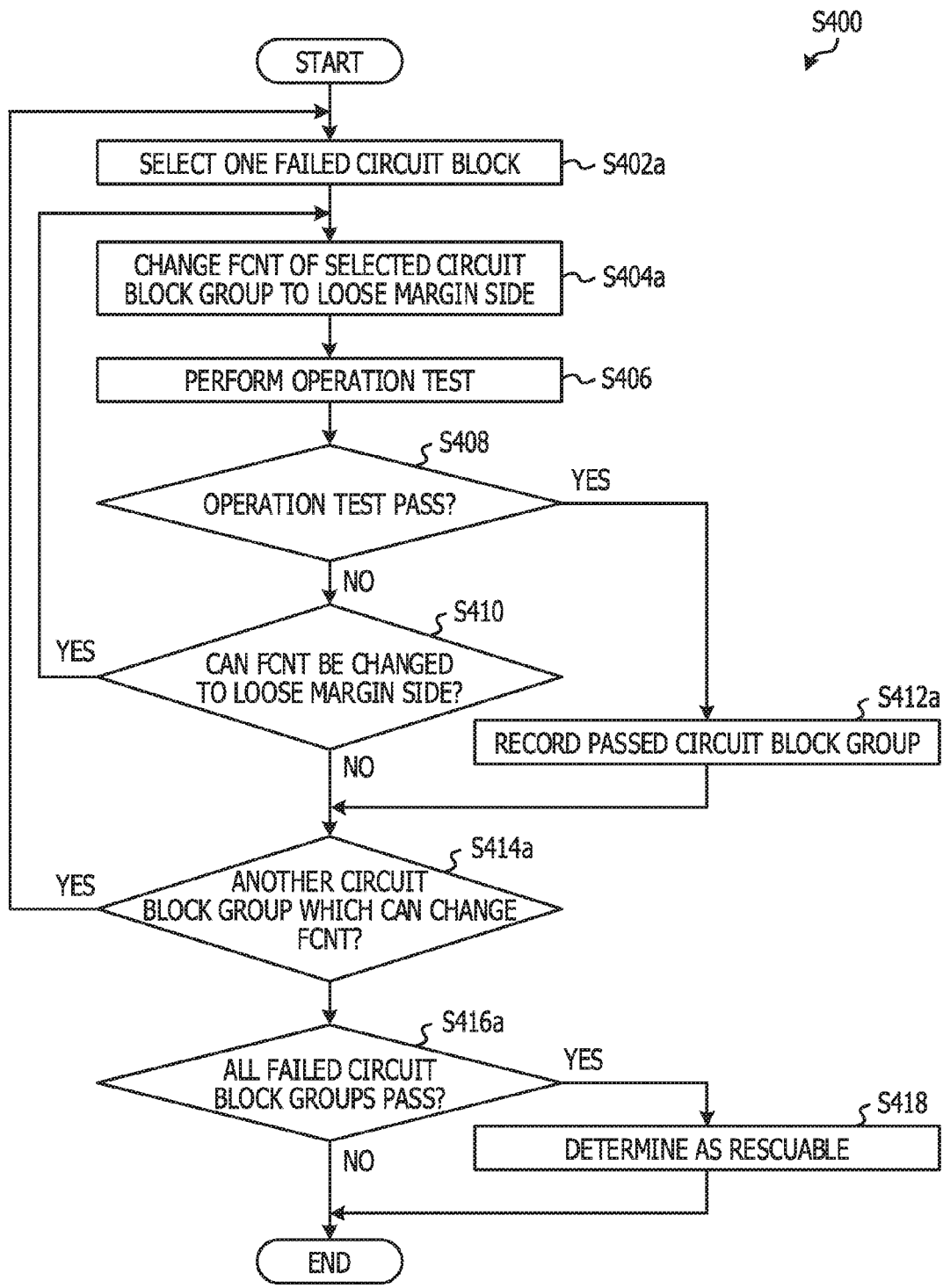
FIG. 24 is a view illustrating one example of a process of Step S400 in a test flow of the semiconductor device illustrated in FIG. 23.

FIG. 24 illustrates one example of a process of Step S400 in a test flow of the semiconductor device SEM6 illustrated in FIG. 23. Detailed explanation about the same process as that in FIG. 20 will be omitted. In addition, the entire test flow is the same as that in FIG. 19. In FIG. 24, Steps S402a, S404a, S412a, S414a, and S416a are performed, instead of Steps S402, S404, S412, S414, and S416 illustrated in FIG. 20. The processes of Steps S402a, S404a, S412a, S414a, and S416a are the same as those in Steps S402, S404, S412, S414, and S416, except that the processes are performed for each circuit block 42 rather than each circuit block group 42. That is, in this embodiment, a process of setting a margin of the frequency control signal FCNT to be tight and setting the margin of the frequency control signal FCNT to be loose is performed for each circuit block 42. This makes it possible to optimize the frequency control signal FCNT according to the electrical characteristics of each of the circuit blocks 42. In contrast, in the embodiment illustrated in FIGS. 17 to 20, the common frequency control signal FCNT is supplied to all circuit blocks 40 of the circuit block groups with the common gating-enable frequency. Therefore, when each circuit block group 40 includes even one circuit block 40 whose ability of the gating-enable frequency is not higher than a designed value, a process of setting the frequency control signal FCNT to a tight margin side is not performed. In addition, when each circuit block group 40 includes even one circuit block 40 whose ability of the gating-enable frequency is lower than the designed value, the frequency control signals FCNT of all circuit blocks 40 in the circuit block groups are set to a loose margin side.

As described above, the embodiment illustrated in FIGS. 23 and 24 may achieve the same effects as those in the embodiment illustrated in FIGS. 1 to 16. In addition, in the embodiment illustrated in FIGS. 23 and 24, it is possible to optimize the frequency control signal FCNT according to the electrical characteristics of each of the circuit blocks 42.

In addition, when a DVFS method is employed for the above-described semiconductor devices SEM1, SEM2, SEM3, SEM4, SEM5, and SEM6, the design illustrated in FIG. 11 is performed using the worst power supply voltage condition that a timing margin of the clock gating circuit GB is decreased. In addition, the tests illustrated in FIGS. 15 and 16 are performed using the worst power supply voltage condition that a timing margin of the clock gating circuit GB is decreased. Further, when the DVFS method is employed, the frequency control signal FCNT may be generated using not only the frequency signal FTBL[4:0] but also a voltage signal stored in a voltage setting table in which power supply voltages are set. Here, a voltage generating circuit for generating a variable power supply voltage generates a power supply voltage indicated by a logical value of the voltage signal stored in the voltage setting table.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
a clock synchronizing circuit that operates in synchronization with a first clock;
an enable signal generating circuit that generates an enable signal in an operation period during which the clock synchronizing circuit is operated; and
a clock supplying circuit that
supplies a second clock to the clock synchronizing circuit or stops supplying the second clock to the clock synchronizing circuit according to the enable signal when a frequency of the first clock is equal to or lower than a predetermined frequency, and
supplies the second clock to the clock synchronizing circuit, irrespective of the enable signal, when the frequency of the first clock is higher than the predetermined frequency.

2. The semiconductor device according to claim 1, wherein the clock supplying circuit includes:
an enable signal control circuit that
outputs a clock control signal in a valid or invalid state based on the enable signal received from the enable signal generating circuit when the frequency of the first clock is equal to or lower than the predetermined frequency, and
sets the clock control signal to be valid when the frequency of the first clock is higher than the predetermined frequency.

3. The semiconductor device according to claim 1, further comprising:
a plurality of circuit blocks, each of which includes the clock synchronizing circuit, the enable signal generating circuit, and the clock supplying circuit,
wherein the predetermined frequency is set for each of the plurality of circuit blocks based on a timing margin of the clock supplying circuit for controlling the supplying of the second clock to the clock synchronizing circuit or the stopping of the supply of the second clock to the clock synchronizing circuit according to the enable signal.

4. The semiconductor device according to claim 1, further comprising:
a frequency setting table that includes frequency information having different values for different clock frequencies, and outputs one value of the frequency information based on a frequency signal indicating a set value of the frequency of the first clock; and
a clock generating circuit that generates the first clock by the frequency information output from the frequency setting table,
wherein the clock supplying circuit detects whether or not the frequency of the first clock is the predetermined frequency by using the frequency information output from the frequency setting table.

5. The semiconductor device according to claim 4, further comprising:
a test switch that outputs one of the values of the frequency information to the clock supplying circuit based on a switch control signal; and
a switch control circuit that generates the switch control signal based on a switch setting signal, stores a value of the switch control signal based on a switch program signal, and outputs the stored switch control signal.

6. The semiconductor device according to claim 5, wherein the test switch is commonly coupled to the clock supplying circuit having the same predetermined frequency determined based on a timing margin of the clock supplying circuit.

7. A method for controlling a semiconductor device including a clock synchronizing circuit that operates in synchronization with a first clock, an enable signal generating circuit, and a clock supplying circuit, the method comprising:
generating, by the enable signal generating circuit, an enable signal in an operation period during which the clock synchronizing circuit is operated;
supplying, by the clock supplying circuit, a second clock to the clock synchronizing circuit or stopping the supply of the second clock to the clock synchronizing circuit according to the enable signal when a frequency of the first clock is equal to or lower than a predetermined frequency; and
supplying, by the clock supplying circuit, the second clock to the clock synchronizing circuit, irrespective of the enable signal, when the frequency of the first clock is higher than the predetermined frequency.

\* \* \* \* \*